United States Patent
Chai et al.

(10) Patent No.: US 12,294,014 B2
(45) Date of Patent: May 6, 2025

(54) LIGHT EMITTING DEVICE AND METHOD FOR MANUFACTURING SAME

(71) Applicant: Samsung Display Co., Ltd., Yongin-si (KR)

(72) Inventors: Chong Chul Chai, Seoul (KR); Hyun Joon Kim, Hwaseong-si (KR); Hyun Min Cho, Seoul (KR); Kyung Bae Kim, Seongnam-si (KR); Min Jae Jeong, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 731 days.

(21) Appl. No.: 17/281,500

(22) PCT Filed: Jun. 11, 2019

(86) PCT No.: PCT/KR2019/006991
§ 371 (c)(1),
(2) Date: Mar. 30, 2021

(87) PCT Pub. No.: WO2020/071614
PCT Pub. Date: Apr. 9, 2020

(65) Prior Publication Data
US 2021/0399040 A1 Dec. 23, 2021

(30) Foreign Application Priority Data
Oct. 1, 2018 (KR) .................. 10-2018-0117061

(51) Int. Cl.
*H01L 27/15* (2006.01)
*B82B 3/00* (2006.01)
(Continued)

(52) U.S. Cl.
CPC .......... *H01L 27/156* (2013.01); *B82B 3/0052* (2013.01); *H01L 33/24* (2013.01);
(Continued)

(58) Field of Classification Search
CPC ............ H01L 33/0008; H01L 33/0016; H01L 33/005; H01L 33/007; H01L 33/0075;
(Continued)

(56) References Cited

U.S. PATENT DOCUMENTS 10,367,123 B2 7/2019 Im et al.
10,461,123 B2 10/2019 Kim et al.
(Continued)

FOREIGN PATENT DOCUMENTS

| CN | 107509284 A | 12/2017 |
|----|-------------|---------|
| CN | 107611153 A | 1/2018  |

(Continued)

OTHER PUBLICATIONS

International Search Report for corresponding Application No. PCT/KR2019/006991 dated Sep. 27, 2019, 4pp.
(Continued)

*Primary Examiner* — Natalia A Gondarenko
(74) *Attorney, Agent, or Firm* — Womble Bond Dickinson (US) LLP

(57) ABSTRACT

A light emitting device comprises: a substrate; a first electrode on the substrate, the first electrode having holes, and having inclined surfaces along the peripheries of the holes; second electrodes on the substrate, each of which is in a respective one of the holes of the first electrode; and light emitting elements between the first electrode and the second electrodes, the light-emitting elements being electrically connected to the first electrode and the second electrodes.

16 Claims, 25 Drawing Sheets

(51) Int. Cl.
*H01L 33/24* (2010.01)
*H01L 33/38* (2010.01)
*H01L 33/40* (2010.01)
*H01L 33/44* (2010.01)

(52) U.S. Cl.
CPC ............ *H01L 33/38* (2013.01); *H01L 33/405* (2013.01); *H01L 33/44* (2013.01); *H01L 2933/0016* (2013.01)

(58) Field of Classification Search
CPC ......... H01L 33/08; H01L 33/24; H01L 33/20; H01L 33/36; H01L 33/38; H01L 33/382; H01L 33/385; H01L 33/387; H01L 27/12–1255; H01L 27/1214–1296; H01L 27/1248; H01L 27/1262; H01L 27/156; H01L 27/256; H01L 33/30; H01L 33/32; H01L 33/405; H01L 33/44; H01L 33/46; H01L 33/50; H01L 33/52; H01L 33/54; H01L 33/58; H01L 33/62; H01L 33/60; H01L 33/0079; H01L 33/0093; H01L 2933/0016; H01L 2933/0066; H01L 2933/0083; H01L 29/1604; H01L 29/78663; H01L 25/167; H01L 25/0753; G09F 9/33; H10K 50/10; H10K 50/80; H10K 50/805; H10K 50/813; H10K 50/816; H10K 50/822; H10K 50/82; H10K 50/824; H10K 50/828; H10K 50/84; H10K 59/10; H10K 59/12; H10K 59/121; H10K 59/1213; H10K 59/1216; H10K 59/122; H10K 59/123; H10K 59/124; H10K 59/126; H10K 59/805; H10K 59/8051; H10K 59/80515; H10K 59/80517; H10K 59/8052; H10K 59/80521; H10K 59/80524; H10K 59/84; H10K 59/86; H10K 59/87; H10K 59/873; B82B 3/0052
USPC .. 257/79, 88, 89, 98, 77, 76, 100, 102, 103, 257/117, 118
See application file for complete search history.

(56) References Cited

U.S. PATENT DOCUMENTS

| | | | |
|---|---|---|---|
| 10,741,728 B2 * | 8/2020 | Kim | ...................... H01L 33/486 |
| 2010/0109022 A1 | 5/2010 | Kim et al. | |
| 2010/0109645 A1 | 5/2010 | Park et al. | |
| 2010/0181592 A1 * | 7/2010 | Yamazaki | .......... H10K 59/1213 257/98 |
| 2015/0162376 A1 * | 6/2015 | Yoon | ....................... H01L 27/15 257/99 |
| 2015/0333102 A1 | 11/2015 | Sato | |
| 2017/0358563 A1 | 12/2017 | Cho et al. | |
| 2018/0012876 A1 | 1/2018 | Kim et al. | |
| 2018/0019369 A1 | 1/2018 | Cho et al. | |
| 2018/0114800 A1 * | 4/2018 | Pan | ..................... H01L 27/1218 |
| 2018/0122836 A1 * | 5/2018 | Kang | ....................... H01L 33/60 |
| 2019/0019930 A1 | 1/2019 | Do et al. | |
| 2020/0075823 A1 * | 3/2020 | Yang | ....................... H01L 33/58 |
| 2021/0050483 A1 * | 2/2021 | Bilenko | ................ H01L 33/486 |
| 2021/0210666 A1 | 7/2021 | Do et al. | |

FOREIGN PATENT DOCUMENTS

| | | | | |
|---|---|---|---|---|
| JP | 2008-235792 A | 10/2008 | | |
| JP | 2015-220069 A | 12/2015 | | |
| KR | 10-2008-0069995 A | 7/2008 | | |
| KR | 10-2010-0054197 A | 5/2010 | | |
| KR | 10-2015-0006798 A | 1/2015 | | |
| KR | 10-1730977 B1 | 4/2017 | | |
| KR | 10-2017-0141305 A | 12/2017 | | |
| KR | 10-2018-0007025 A | 1/2018 | | |
| KR | 10-2018-0007376 A | 1/2018 | | |
| WO | WO-2017123039 A1 * | 7/2017 | ........... A45C 13/103 | |

OTHER PUBLICATIONS

Office action issued in corresponding Chinese Application No. 201980065203.X, dated Jan. 26, 2024, 6pp.

\* cited by examiner

510 : 511, 512, 513
420 : 421, 422
120 : 121, 123, 124, 126
140 : 141, 143, 144, 146

LIGHT EMITTING DEVICE AND METHOD FOR MANUFACTURING SAME

CROSS-REFERENCE TO RELATED APPLICATION

This application is a U.S. National Phase Patent Application of International Patent Application Number PCT/KR2019/006991, filed on Jun. 11, 2019, which claims priority to Korean Patent Application Number 10-2018-0117061, filed on Oct. 1, 2018, the entire content of all of which is hereby incorporated by reference.

FIELD

Embodiments of the present disclosure relate to a device including light-emitting diodes and a method of manufacturing the same.

BACKGROUND

Light-emitting diodes (LEDs) are elements that convert electrical signals into a form of light such as infrared rays, visible light, and/or the like using the characteristics of compound semiconductors, and the LEDs are used in home appliances, remote controllers, electronic boards, various suitable types or kinds of automation devices, and the like, and an application range of the LEDs is gradually expanding.

Furthermore, attempts to apply LEDs to a display device are expanding. For example, attempts to use the LEDs as a backlight of a display device or to directly implement a self-emissive display device by miniaturizing the LEDs into units of fine pixels capable of displaying an image are expanding.

Accordingly, in order to reduce the size of the LEDs and secure suitable or sufficient brightness to be used in various suitable types or kinds of devices, a structure in which several LEDs may be integrated is required.

SUMMARY

Light-emitting devices may be prepared so that walls are formed around a light-emitting diode and a reflective electrode is formed on the wall to reflect light emitted from a side surface of the light-emitting diode forward, thereby increasing light emission efficiency of the light-emitting diode.

However, a process of manufacturing a light-emitting device may be complicated due to the formation of the walls, the formation of the reflective electrodes, and/or the like.

Accordingly, the present disclosure is directed to providing a light-emitting device that is allowed to be manufactured through a more simplified process.

Further, the present disclosure is also directed to providing a method of manufacturing a light-emitting device with improved light emission efficiency.

The scope of the present disclosure is not limited to the above-described objects and other unmentioned objects may be clearly understood by those skilled in the art from the following descriptions.

According to embodiments of the present disclosure, a light-emitting device includes: a substrate, a first electrode on the substrate, the first electrode having holes, and having inclined surfaces along peripheries of the holes, second electrodes on the substrate, each of which is in a respective one of the holes of the first electrode, and light-emitting elements between the first electrode and the second electrodes, the light-emitting elements being electrically connected to the first electrode and the second electrodes.

The light-emitting device may further include: a transistor electrically connected to the first electrode; and a power line electrically connected to the second electrodes.

The power line may be below the substrate, and each of the second electrodes may be electrically connected to the power line through a through-hole which passes through the substrate to expose the power line.

The first electrode may include a first metal bonding layer, a metal conductive layer on the first metal bonding layer, and a second metal bonding layer on the metal conductive layer. The metal conductive layer may have a thickness which is greater than a thickness of the first metal bonding layer and greater than a thickness of the second metal bonding layer, and the inclined surfaces may be on the metal conductive layer.

The metal conductive layer may include a reflective material, and light emitted from the light-emitting elements may be reflected by the metal conductive layer.

An inclination angle formed by the inclined surface based on the substrate may be less than 60 degrees and greater than 20 degrees.

A first taper angle of an inner sidewall of the metal conductive layer may be different from a second taper angle of an outer sidewall of the metal conductive layer, and the inner sidewall of the metal conductive layer may be adjacent to the second electrode.

The inner sidewall of the metal conductive layer may be formed through a process different from a process of forming the outer sidewall of the metal conductive layer.

The light-emitting device may further include a first pixel wall on the first electrode, wherein the first pixel wall may include bank holes corresponding to the holes of the first electrode.

The light-emitting device may further include a second pixel wall on each of the second electrodes.

Each of the second electrodes may have a central portion, a first peripheral portion which is spaced apart from the central portion and extends along an edge of the central portion, and the central portion has two end portions spaced apart from each other and a first connection portion to connect the central portion to the first peripheral portion. The first electrode may include a main body portion having the holes, a second peripheral portion which extends along the edge of the central portion between the central portion and the first peripheral portion and has two end portions with the first connection portion interposed therebetween, and a second connection portion which crosses the end portions of the first peripheral portion to connect the second peripheral portion to the main body portion.

The central portion may have a circular planar shape, and each of the first peripheral portion and the second peripheral portion may have a ring shape in which a portion is cut in a top view.

The light-emitting device may further include a first insulating layer below the light-emitting elements between the first electrode and the second electrodes, an organic insulating layer covering the light-emitting elements and exposing two end portions of each of the light-emitting elements, a first contact electrode which is electrically connected to the first electrode, is on the organic insulating layer, and is in contact with a first end portion of each of the light-emitting elements, and a second contact electrode which is electrically connected to the second electrodes, is on the organic insulating layer, and is in contact with a second end portion of each of the light-emitting elements.

The first contact electrode and the second contact electrode may face each other and be spaced apart from each other, and the light-emitting device may further include a second insulating layer covering the first contact electrode and the second contact electrode, the second insulating layer being in a region in which the first contact electrode is spaced apart from the second contact electrode.

The first contact electrode and the second contact electrode may be substantially coplanar.

Each of the light-emitting elements may have a cylindrical shape, and a portion of a lower surface of each of the light-emitting elements may be in direct contact with the first insulating layer.

According to embodiments of the present disclosure, a method of manufacturing a light-emitting device includes: forming an electrode layer on a substrate, patterning the electrode layer and forming first pixel electrodes arranged independently of each other and unseparated electrode patterns surrounding the first pixel electrodes, arranging light-emitting elements on the unseparated electrode patterns and the first pixel electrodes, forming an electric field between the unseparated electrode patterns and the first pixel electrodes and aligning the light-emitting elements, and patterning the unseparated electrode patterns and forming a second pixel electrode surrounding at least one of the first pixel electrodes.

The unseparated electrode patterns may have a mesh structure.

The forming of the first pixel electrodes and the unseparated electrode patterns may include forming a first insulating layer on the first pixel electrodes and the unseparated electrode patterns, and between the first pixel electrodes and the unseparated electrode patterns, and the light-emitting elements may be on the first insulating layer.

The forming of the first pixel electrodes and the unseparated electrode patterns may further include forming a first pixel wall on the first insulating layer, and the first pixel wall may overlap the unseparated electrode pattern and surround each of the first pixel electrodes in a top view.

The above and other features of the present disclosure will become more apparent by describing in more detail embodiments thereof with reference to the attached drawings.

According to embodiments of the present disclosure, a light-emitting device includes a first electrode and a second electrode which function as an integrated reflective electrode, and thus the light-emitting device can be manufactured through a more simplified process.

Further, the first electrode is disposed to surround the second electrode and a light-emitting element is disposed between the first electrode and the second electrode, and thus an arrangement area of a region in which the light-emitting element is disposed can be increased and light emission efficiency can be improved.

According to embodiments of the present disclosure, in a method of manufacturing a light-emitting device, an electric field is formed using an unseparated electrode pattern before a first electrode is patterned, and thus alignment efficiency of a light-emitting element can be improved.

Effects according to the embodiments of the present disclosure are not limited by the content described above and additional various effects are included in the scope of this specification.

DETAILED DESCRIPTION

The subject matter of the present disclosure will now be described more fully hereinafter with reference to the accompanying drawings, in which embodiments of the disclosure are shown. The subject matter of this disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

It will also be understood that when a layer is referred to as being "on" another layer or substrate, it can be directly on the other layer or substrate, or intervening layers may also be present. The same reference numbers indicate the same components throughout the specification.

It will be understood that, although the terms "first," "second," etc. may be used herein to describe various elements, these elements should not be limited by these terms. These terms are only used to distinguish one element from another element. For instance, a first element discussed below could be termed a second element without departing from the spirit and scope of the present disclosure. Similarly, the second element could also be termed the first element.

Hereinafter, embodiments of the present disclosure will be described with reference to the attached drawings.

Figure 1:
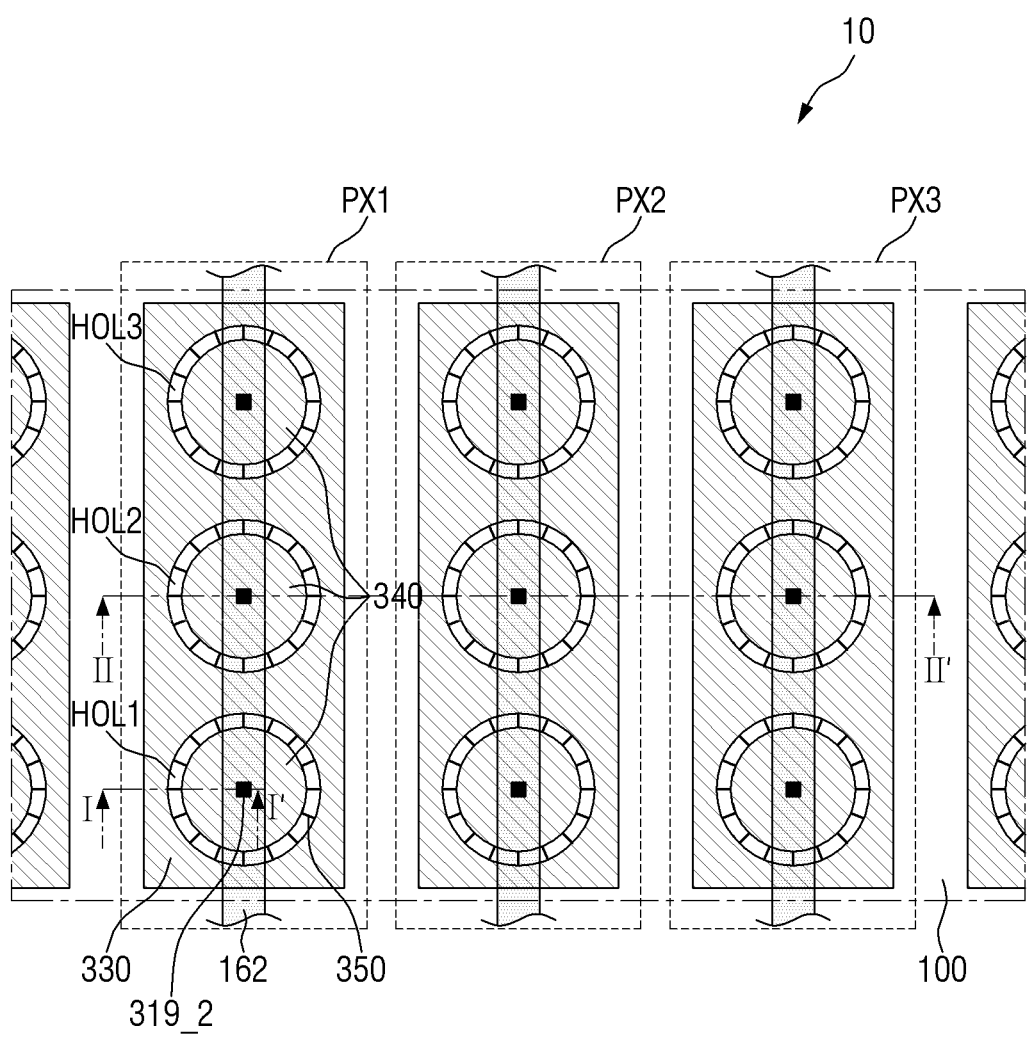
FIG. 1 is a plan view of a light-emitting device according to an embodiment.

FIG. 1 is a plan view of a light-emitting device according to an embodiment.

Referring to FIG. 1, a light-emitting device 10 may include a first pixel PX1, a second pixel PX2, and a third pixel PX3. The first pixel PX1, the second pixel PX2, and the third pixel PX3 may be repeatedly arranged in a first direction D1.

Each of the first pixel PX1, the second pixel PX2, and the third pixel PX3 may be a light-emitting unit of a minimum unit that emits light. When the light-emitting device 10 displays an image, each of the first pixel PX1, the second pixel PX2, and the third pixel PX3 may be a light-emitting unit of a minimum unit that displays a color included in the image. The first pixel PX1, the second pixel PX2, and the third pixel PX3 may emit pieces or beams of light having different colors. For example, the first pixel PX1 may emit light having a first color (e.g., red), the second pixel PX2 may emit light having a second color (e.g., green), and the third pixel PX3 may emit light having a third color (e.g., blue). Colors may be realized through a combination of the colors emitted by the first pixel PX1, the second pixel PX2, and the third pixel PX3. The first pixel PX1, the second pixel PX2, and the third pixel PX3 will be described below with reference to FIG. 19.

The first pixel PX1, the second pixel PX2, and the third pixel PX3 may be substantially the same except for colors of the pieces or beams of emitted light. Hereinafter, common characteristics of the first pixel PX1, the second pixel PX2, and the third pixel PX3 will be described based on the first pixel PX1, and overlapping descriptions will not be repeated.

The first pixel PX1 may include a first electrode 330 (or a pixel electrode), second electrodes 340 (or common electrodes), and light-emitting elements 350, which are formed on a circuit board 100 (or a substrate). The circuit board 100 may be included in the light-emitting device 10.

The circuit board 100 (or the substrate) may include a transistor (not illustrated) that supplies a current to the first pixel PX1 and a power electrode 162. The circuit board 100 will be described below with reference to FIG. 2.

The first electrode 330 may be disposed on the circuit board 100. The first electrode 330 may have a rectangular shape, in which a length in the first direction D1 is smaller than a length in a second direction D2, but the above shape is an example, and the present disclosure is not limited thereto.

The first electrode 330 may include a plurality of holes. For example, the first electrode 330 may include a first hole HOL1, a second hole HOL2, and a third hole HOL3 which are arranged in the second direction D2, but the present disclosure is not limited thereto. For example, the first electrode 330 may include one hole, two holes, or four or more holes.

Hereinafter, an example in which the first electrode 330 includes the first hole HOL1, the second hole HOL2, and the third hole HOL3 will be described.

Each of the first hole HOL1, the second hole HOL2, and the third hole HOL3 may form a closed loop in a plan view and may not be connected to the outside.

As illustrated in FIG. 1, each of the first hole HOL1, the second hole HOL2, and the third hole HOL3 may have a circular planar shape. However, the above shape is an example and the present disclosure is not limited thereto. Each of the first hole HOL1, the second hole HOL2, and the third hole HOL3 is not limited in a shape as long as the shape can provide a space in which the second electrode 340 is disposed. For example each of the first hole HOL1, the second hole HOL2, and the third hole HOL3 may have a planar shape such as an elliptical shape, a polygonal shape, a rectangular shape or more.

The second electrode 340 may be disposed on the circuit board 100. The plurality of second electrodes 340 may be provided, for example, three second electrodes 340 may be provided to correspond to the first to third holes HOL1, HOL2, and HOL3. Each of the second electrodes 340 may be positioned in one of the first to third holes HOL1, HOL2, and HOL3. The second electrodes 340 may be surrounded by the first electrode 330.

The light-emitting elements 350 may be disposed between the first electrode 330 and the second electrodes 340 on the circuit board 100 and may be electrically connected to the first electrode 330 and the second electrodes 340. For example, the light-emitting elements 350 may be repeatedly arranged along an edge of the second electrode 340 in the first hole HOL1 of the first electrode 330. The light-emitting elements 350 may be arranged irregularly (or at non-regular intervals), but the present disclosure is not limited thereto. For example, the light-emitting elements 350 may be repeatedly arranged at regular intervals (or at an isometric angle based on an area center of the second electrode 340).

The second electrode 340 may be electrically connected to the power electrode 162.

The power electrode 162 may be disposed inside the circuit board 100, may extend in the second direction D2, and may be connected to the second electrodes 340. In the circuit board 100, contact holes 319_2 (or fifth contact holes) which passes through an upper surface of the circuit board 100 to expose the power electrode 162 may be formed, and the second electrodes 340 may be electrically connected to the power electrode 162 through the contact holes 319_2 (or the fifth contact holes).

As described with reference to FIG. 1, the first electrode 330 may include the first to third holes HOL1, HOL2, and HOL3, each of the second electrodes 340 may be disposed in one of the first to third holes HOL1, HOL2, and HOL3, and the light-emitting elements 350 may be repeatedly disposed along the edges of the second electrodes 340 in the first to third holes HOL1, HOL2, and HOL3. In this case, an arrangement area (or an arrangement space) in which the light-emitting elements 350 are disposed between the first electrode 330 and the second electrodes 340 may be greater than an arrangement area (e.g., an area of a region in which the light-emitting elements are disposed) in which light-emitting elements are disposed between electrodes having a linear form, more light-emitting elements 350 may be disposed, and thus maximum luminance of the light-emitting device 10 may be improved.

Meanwhile, in FIG. 1, the power electrode 162 is illustrated as extending in the second direction D2 (e.g., in a column direction) and crossing each of the first to third pixels PX1, PX2, and PX3, but the above configuration is an example and the power electrode 162 is not limited thereto. For example, the power electrode 162 may extend in a row direction or may be arranged in the form of a mesh.

Figure 2:
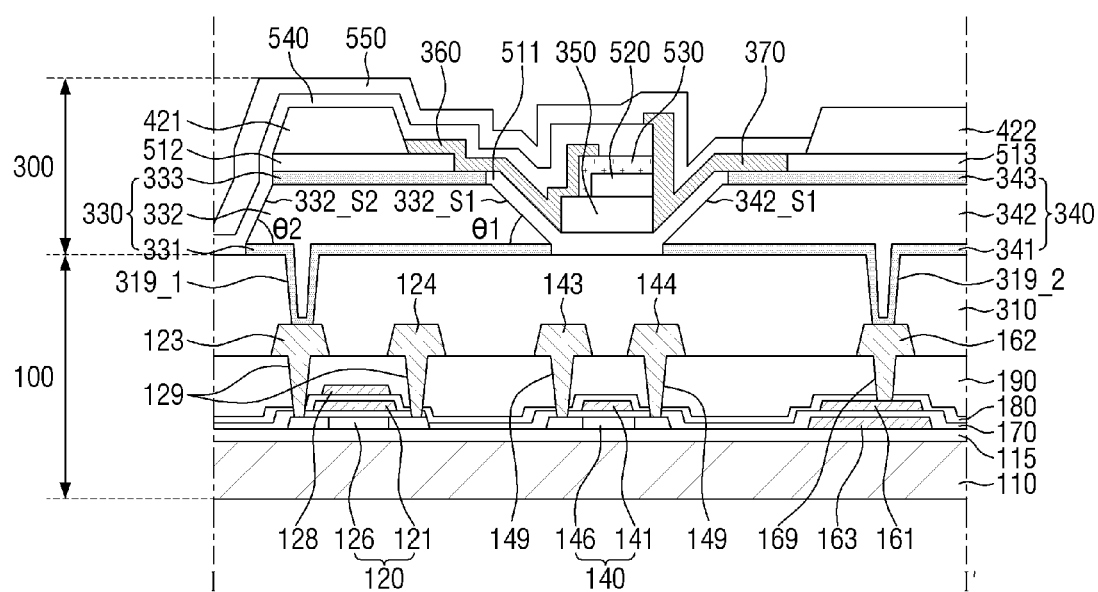
FIG. 2 is a cross-sectional view illustrating an example of the light-emitting device taken along line I-I' of FIG. 1.

FIG. 2 is a cross-sectional view illustrating an example of the light-emitting device taken along line I-I' of FIG. 1.

Referring to FIG. 2, the light-emitting device 10 may include a circuit board 100 (or a circuit element layer) and a light-emitting element layer 300. The circuit board 100 includes a substrate 110, a first transistor 120 (or a first thin film transistor, a first switching element), and a second transistor 140 (or a second thin film transistor, a second switching element). The transistors 120 and 140 may include active layers 126 and 146, gate electrodes 121 and 141, source electrodes 124 and 144, and drain electrodes 123 and 143, respectively. The light-emitting element layer 300 may include a first electrode 330, a second electrode 340, and a light-emitting element 350. The transistors 120 and 140, the first electrode 330, the second electrode 340, and the light-emitting element 350 described above may constitute a pixel circuit. An example of the pixel circuit is illustrated in FIG. 25.

Figure 25:
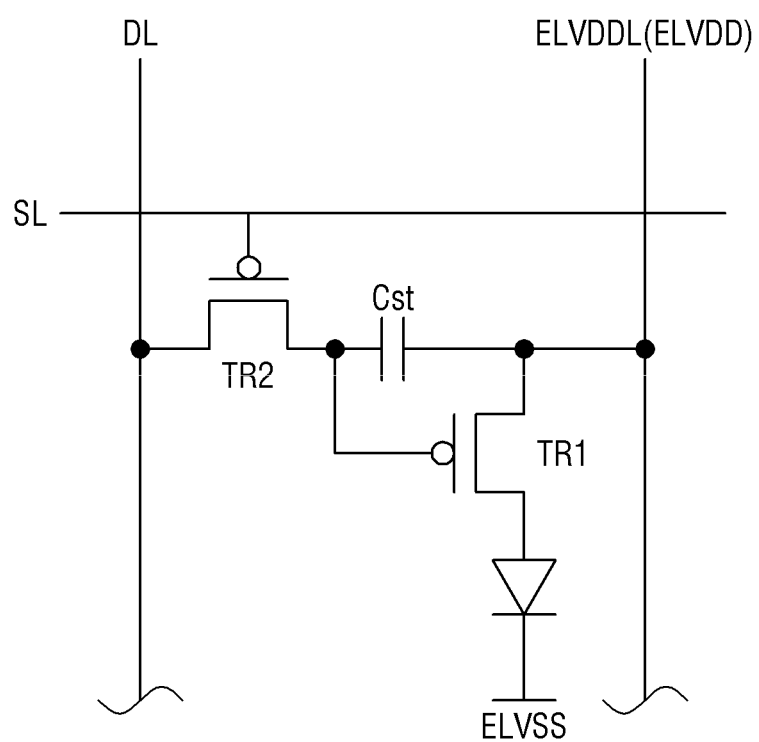
FIG. 25 is a circuit diagram of one pixel of a light-emitting device according to an embodiment.

FIG. 25 is a circuit diagram of one pixel of a light-emitting device according to an embodiment.

Referring to FIG. 25, a pixel circuit may include a first transistor TR1 (120 in FIG. 2), a second transistor TR2 (140 in FIG. 2), a capacitor Cst, and a light-emitting diode (LED).

The first transistor TR1 may be a driving transistor, and the second transistor TR2 may be a switching transistor. FIG. 25 illustrates a case in which both of the first transistor TR1 and the second transistor TR2 are p-channel metal-oxide-semiconductor (PMOS) transistors, but any one or both of the first transistor TR1 and the second transistor TR2 may be n-channel metal-oxide-semiconductor (NMOS) transistors.

A source electrode (124 in FIG. 2) of the first transistor TR1 is connected to a first power line ELVDDL and a drain electrode (123 in FIG. 2) is connected to an anode electrode (the first electrode 330 in FIG. 2) of an organic light-emitting diode (OLED). A source electrode (144 in FIG. 2) of the second transistor TR2 is connected to a data line DL, and a drain electrode (143 in FIG. 2) is connected to a gate electrode (121 in FIG. 2) of the first transistor TR1. The capacitor Cst is connected between the gate electrode and the source electrode of the first transistor TR1. A cathode electrode (the second electrode 340 in FIG. 2) of the LED receives a second power voltage ELVSS. The second power voltage ELVSS may be a voltage lower than a first power voltage ELVDD provided from the first power line ELVDDL.

The second transistor TR2 may output a data signal applied to the data line DL in response to a scan signal applied to a scan line SL. The capacitor Cst may charge a voltage corresponding to the data signal received from the second transistor TR2. The first transistor TR1 may control a driving current flowing through the LED to correspond to an amount of charge stored in the capacitor Cst. An equivalent circuit diagram of FIG. 25 is only one embodiment, and the pixel circuit may include a larger number (e.g., seven) of transistors and capacitors.

Referring to FIG. 2 again, the circuit board 100 may include the substrate 110, a buffer layer 115, a semiconductor layer, a first insulating layer 170, a first conductive layer, a second insulating layer 180, a second conductive layer, a third insulating layer 190, a third conductive layer, and a fourth insulating layer 310.

The substrate 110 may be an insulating substrate. The substrate 110 may be made of an insulating material such as glass, quartz, a polymer resin, and/or the like. The polymer material may include polyethersulphone (PES), polyacrylate (PA), polyarylate (PAR), polyetherimide (PEI), polyethylene naphthalate (PEN), polyethylene terephthalate (PET), polyphenylene sulfide (PPS), polyallylate, polyimide (PI), polycarbonate (PC), cellulose triacetate (CAT), cellulose acetate propionate (CAP), or a combination thereof. The substrate 110 may be a rigid substrate but may be a flexible substrate which is capable of being bent, folded, rolled, and/or the like.

The buffer layer 115 may be disposed on the substrate 110. The buffer layer 115 may prevent or reduce the diffusion of impurity ions, prevent or reduce the penetration of moisture and/or external air, and perform a surface planarization function. The buffer layer 115 may include silicon nitride, silicon oxide, silicon oxynitride, and/or the like.

The semiconductor layer may be disposed on the buffer layer 115. The semiconductor layer may include a first active layer 126 of the first transistor 120, a second active layer 146 of the second transistor 140, and an auxiliary layer 163. The semiconductor layer may include polycrystalline silicon, single crystalline silicon, oxide semiconductor, and/or the like.

The first insulating layer 170 may be disposed on the semiconductor layer. The first insulating layer 170 may cover the semiconductor layer. The first insulating layer 170 may function as a gate insulating film of a transistor. The first insulating layer 170 may include silicon oxide, silicon nitride, silicon oxynitride, aluminum oxide, tantalum oxide, hafnium oxide, zirconium oxide, titanium oxide, and/or the like. The above materials may be used alone or in combination with each other.

The first conductive layer may be disposed on the first insulating layer 170. The first conductive layer may include a first gate electrode 121 disposed on the first active layer 126 of the first transistor 120 with the first insulating layer 170 interposed therebetween, a second gate electrode 141 disposed on the second active layer 146 of the second transistor 140, and a power line 161 disposed on the auxiliary layer 163. The first conductive layer may include one or more metals selected from among molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and copper (Cu). The first conductive layer may be a single film or a multilayered film.

The second insulating layer 180 may be disposed on the first conductive layer. The second insulating layer 180 may be made of an inorganic insulating material such as silicon oxide, silicon nitride, silicon oxynitride, hafnium oxide, aluminum oxide, titanium oxide, tantalum oxide, zinc oxide, and/or the like.

The second conductive layer may be disposed on the second insulating layer 180. The second conductive layer may include a capacitor electrode 128 disposed on the first gate electrode 121 with the second insulating layer interposed therebetween. The capacitor electrode 128 may form a storage capacitor (e.g., a capacitor that stores or maintains an electrical signal) together with the first gate electrode 121.

The second conductive layer, similar to the first conductive layer, may include one or more metals selected from among molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and copper (Cu).

The third insulating layer 190 may be disposed on the second conductive layer. The third insulating layer 190 may be an interlayer insulating film. Further, the third insulating layer 190 may perform a surface planarization function. The third insulating layer 190 may include an organic insulating material such as a polyacrylate resin, an epoxy resin, a phenolic resin, a polyamide resin, a polyimide resin, an unsaturated polyester resin, a polyphenylene ether resin, a polyphenylene sulfide resin, benzocyclobutene (BCB), and/or the like.

The third conductive layer may be disposed on the third insulating layer 190. The third conductive layer may include a first drain electrode 123 and a first source electrode 124 of the first transistor 120, a second drain electrode 143 and a second source electrode 144 of the second transistor 140, and the power electrode 162 disposed above the power line 161.

Each of the first source electrode 124 and the first drain electrode 123 may be electrically connected to the first active layer 126 through a first contact hole 129 passing through the third insulating layer 190 and the second insulating layer 180. Each of the second source electrode 144 and the second drain electrode 143 may be electrically connected to the second active layer 146 through a second contact hole 149 passing through the third insulating layer 190 and the second insulating layer 180. The power electrode 162 may be electrically connected to the power line 161 through a third contact hole 169 passing through the third insulating layer 190 and the second insulating layer 180.

The third conductive layer may include one or more metals selected from among aluminum (Al), molybdenum (Mo), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and copper (Cu). The third conductive layer may be a single film or a multilayered film. For example, the third conductive layer may be formed in a stacked structure of Ti/Al/Ti, Mo/Al/Mo, Mo/AlGe/Mo, Ti/Cu, and/or the like.

The fourth insulating layer 310 may be disposed on the third conductive layer. The fourth insulating layer 310 may be made of an organic insulating material such as a polyacrylate resin, an epoxy resin, a phenolic resin, a polyamide resin, a polyimide resin, an unsaturated polyester resin, a polyphenylene ether resin, a polyphenylene sulfide resin, BCB, and/or the like. A surface of the fourth insulating layer 310 may be flat.

Hereinafter, the light-emitting element layer 300 will be described.

The first electrode 330 and the second electrode 340 may be disposed on the fourth insulating layer 310. The first electrode 330 may be electrically connected to the first drain electrode 123 of the first transistor 120 through a fourth contact hole 319_1 passing through the fourth insulating layer 310. The second electrode 340 may be disposed to be spaced apart from the first electrode 330 and may be electrically connected to the power electrode 162 through a fifth contact hole 319_2 passing through the fourth insulating layer 310.

The first electrode 330 and the second electrode 340 may include one or more metals selected from among aluminum (Al), molybdenum (Mo), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and copper (Cu). The first electrode 330 and the second electrode 340 may be a single film or a multilayered film. For example, the first electrode 330 and the second electrode 340 may be formed in a stacked structure of Ti/Al/Ti, Mo/Al/Mo, Mo/AlGe/Mo, Ti/Cu, and/or the like.

In an embodiment, the first electrode 330 and the second electrode 340 may include a reflective material (or a material having high reflectivity) having a reflective property of reflecting light. Here, the reflective material may include at least one selected from the group consisting of silver (Ag), magnesium (Mg), chromium (Cr), gold (Au), platinum (Pt), nickel (Ni), copper (Cu), tungsten (W), aluminum (Al), aluminum-lithium (Al—Li), magnesium-indium (Mg—In), and magnesium-silver (Mg—Ag). In this case, the first electrode 330 and the second electrode 340 may function as reflective walls that reflect light emitted from a side surface of the light-emitting element 350.

In an embodiment, at least one of a thickness of the first electrode 330 and a thickness of the second electrode 340 may be greater than a thickness of the light-emitting element 350.

The thickness of the first electrode 330 and the thickness of the second electrode 340 may be determined by positions in a thickness direction of the light-emitting element 350, an angle at which light is emitted from the light-emitting element 350, separation distances from the light-emitting element 350, and/or the like, but the thickness of the first electrode 330 and the thickness of the second electrode 340 may be substantially greater than the thickness (e.g., 5,000 Å) of the light-emitting element 350. For example, the thickness of the first electrode 330 may be 6,000 Å or more, 8,000 Å or more, or 10,000 Å or more, or may be 20,000 Å. Furthermore, the thickness of the first electrode 330 and the thickness of the second electrode 340 may be greater than a length (or a maximum length, for example, 30,000 Å) of the light-emitting element 350. For example, the thickness of the first electrode 330 may be 40,000 Å or more. The thickness of the first electrode 330 and the thickness of the second electrode 340 may be smaller than 100,000 Å.

In an embodiment, the first electrode 330 and the second electrode 340 may have inclined sidewalls or a tapered cross-sectional shape.

An inner sidewall 332_S1 (or a first inclined surface) of the first electrode 330 adjacent to the light-emitting element 350 may form an acute angle with the fourth insulating layer 310. Similarly, an outer sidewall 342_S1 (or an inclined surface) of the second electrode 340 adjacent to the light-emitting element 350 may form an acute angle with the fourth insulating layer 310. For example, the inner sidewall 332_S1 of the first electrode 330 and the outer sidewall 342_S1 of the second electrode 330 which are positioned adjacent to the light-emitting element 350 may be formed to be inclined. In this case, the light emitted from the side surface of the light-emitting element 350 may be substantially reflected upward by the inner sidewall 332_S1 of the first electrode 330 and the outer sidewall 342_S1 of the second electrode 340. Further, an outer sidewall 332_S2 (or a second inclined surface) of the first electrode 330 may also form an acute angle with the fourth insulating layer 310 or may be formed to be inclined.

In some embodiments, a first inclination angle θ1 (or a first taper angle) of the inner sidewall 332_S1 (or the first inclined surface) of the first electrode 330 may be 60 degrees or less, in a range of 20 degrees to 60 degrees, or in a range of 40 degrees to 50 degrees. In this case, the light emitted from the side surface of the light-emitting element 350 may be substantially reflected upward in a region occupied by the first pixel PX1 illustrated in FIG. 1. Similarly, an inclination angle of the outer sidewall 342_S1 of the second electrode 340 may be identical or similar to the first inclination angle θ1. As will be described below, the inner sidewall 332_S1 of the first electrode 330 and the outer sidewall 342_S1 of the second electrode 340 may be formed through the same process (e.g., a patterning process, a masking process, and/or an etching process), and thus the first inclined surface of the first electrode 330 may be substantially the same as the inclined surface of the second electrode 340.

In an embodiment, the first inclination angle θ1 of the inner sidewall 332_S1 of the first electrode 330 may be different from a second inclination angle θ2 (or a second taper angle) of the outer sidewall 332_S2 of the first electrode 330. Here, the outer sidewall 332_S2 of the first electrode 330 may be a side surface formed along an outer edge of the first electrode 330, may be spaced apart from the second electrode 340, and may be adjacent to or may face a first electrode of another pixel (e.g., the second pixel PX2).

As will be described with reference to FIG. 13, the outer sidewall 332_S2 of the first electrode 330 may be formed through a process (or at a different time point) different from a process (or a time point) in which the inner sidewall 332_S1 of the first electrode 330 is formed, and the outer sidewall 332_S2 of the first electrode 330 does not need to function as a reflective wall that reflects light in a set or specific direction. Accordingly, the second inclination angle θ2 of the outer sidewall 332_S2 of the first electrode 330 may be different from the first inclination angle θ1 of the inner sidewall 332_S1 of the first electrode 330. For example, the second inclination angle θ2 of the outer sidewall 332_S2 of the first electrode 330 may be greater than the first inclination angle θ1 of the inner sidewall 332_S1 of the first electrode 330.

However, the above configuration is an example and the present disclosure is not limited thereto. For example, the second inclination angle θ2 of the outer sidewall 332_S2 of the first electrode 330 may be smaller than the first inclination angle θ1 of the inner sidewall 332_S1 of the first electrode 330, and the second inclination angle θ2 of the outer sidewall 332_S2 of the first electrode 330 may be identical to the first inclination angle θ1 of the inner sidewall 332_S1 of the first electrode 330.

In some embodiments, the first electrode 330 and the second electrode 340 may include first metal bonding layers 331 and 341, metal conductive layers 332 and 342, and second metal bonding layers 333 and 343, respectively. Based on the first electrode 330, the first metal bonding layer 331 may be disposed on the circuit board 100 (or the fourth insulating layer 310) and may have low contact resistance with respect to a lower conductive layer (e.g., the first drain electrode 123, the power electrode 162). The metal conductive layer 332 may be disposed on the first metal bonding layer 331 and may have relatively high electrical conductivity (or conductivity). The second metal bonding layer 333 may be disposed on the metal conductive layer 332 and may have relatively high bonding force with a fifth insulating layer 510 to be described below.

The metal conductive layer 332 may have a thickness which is greater than a thickness of the first metal bonding layer 331 and greater than a thickness of the second metal bonding layer 332. In this case, the inclined inner sidewall 332_S1 and the inclined outer sidewall 332_S2 (or the first inclined surface and the second inclined surface) of the first electrode 330 may be formed on the metal conductive layer 332. Similarly, the inclined outer sidewall 342_S1 of the second electrode 340 may be formed on the metal conductive layer 342.

As the metal conductive layer 332 may have a relatively large thickness, the first electrode 330 may be formed relatively thick, and thus a resistance value of the first electrode 330 may be relatively small. Therefore, a drop (e.g., IR drop) of an electrical signal (e.g., a data signal corresponding to an image or a power source V used for an arrangement of the light-emitting elements 350 to be described below) due to the first electrode 330 may be reduced, and alignment efficiency of the light-emitting elements 350 may be improved.

Referring to FIG. 2 again, the fifth insulating layer 510 may be disposed on some regions of the first electrode 330 and the second electrode 340. The fifth insulating layer 510 may be disposed in a space between the first electrode 330 and the second electrode 340. For example, the fifth insulating layer 510 may include a first insulating pattern 511, a second insulating pattern 512, and a third insulating pattern 513.

The first insulating pattern 511 may form closed loops along peripheries (or the edges of the second electrodes 340) of the holes HOL1, HOL2, and HOL3 of the first electrode 330 in a top view, and may have, for example, a ring shape in a top view. The second insulating pattern 512 may be disposed on the first electrode 330 and the third insulating pattern 513 may be disposed on the second electrode 340.

The first insulating pattern 511 may be disposed between the light-emitting element 350 and the fourth insulating layer 310. A lower surface of the first insulating pattern 511 may be in contact with the fourth insulating layer 310 and the light-emitting element 350 may be disposed on an upper surface of the first insulating pattern 511. The first insulating pattern 511 may be in contact with the first electrode 330 and the second electrode 340 at both side surfaces, may physically separate the first electrode 330 from the second electrode 340, and may prevent or reduce direct contact of the first electrode 330 and the second electrode 340 with each other. For example, the first insulating pattern 511 may prevent the first electrode 330 and the second electrode 340 from being directly electrically connected to each other on the same plane.

The fifth insulating layer 510 (or the first insulating pattern 511) may overlap some regions of the first electrode 330 and the second electrode 340, for example, portions of the inclined surfaces of the first electrode 330 and the second electrode 340, which are formed in a direction in which the first electrode 330 and the second electrode 340 face each other. For example, both end portions of the first insulating pattern 511 may cover the inclined surfaces formed in the direction in which the first electrode 330 and the second electrode 340 face each other. The first insulating pattern 511 may protect the regions overlapping the first electrode 330 and the second electrode 340 and, at the same time, may electrically insulate the first electrode 330 from the second electrode 340. Further, direct contact of the first semiconductor layer 351 and the second semiconductor layer 352 of the light-emitting element 350 to be further described below with other base materials may be prevented or reduced so that damage to the light-emitting element 350 may be prevented or reduced.

In FIG. 2, the first insulating pattern 511 is illustrated as extending longer than the light-emitting element 350, but the present disclosure is not limited thereto. For example, the first insulating pattern 511 may have a length similar to a length of the light-emitting element 350, and both side surfaces of the first insulating pattern 511 may be aligned with both side surfaces of the light-emitting element 350.

The first electrode 330 and the second electrode 340 may be disposed to be spaced a set or predetermined interval from each other, and the interval may be smaller than or equal to the length of the light-emitting element 350. In this case, electrical contact between the first and second electrodes 330 and 340 and the light-emitting element 350 may be made smoothly.

Figure 10:
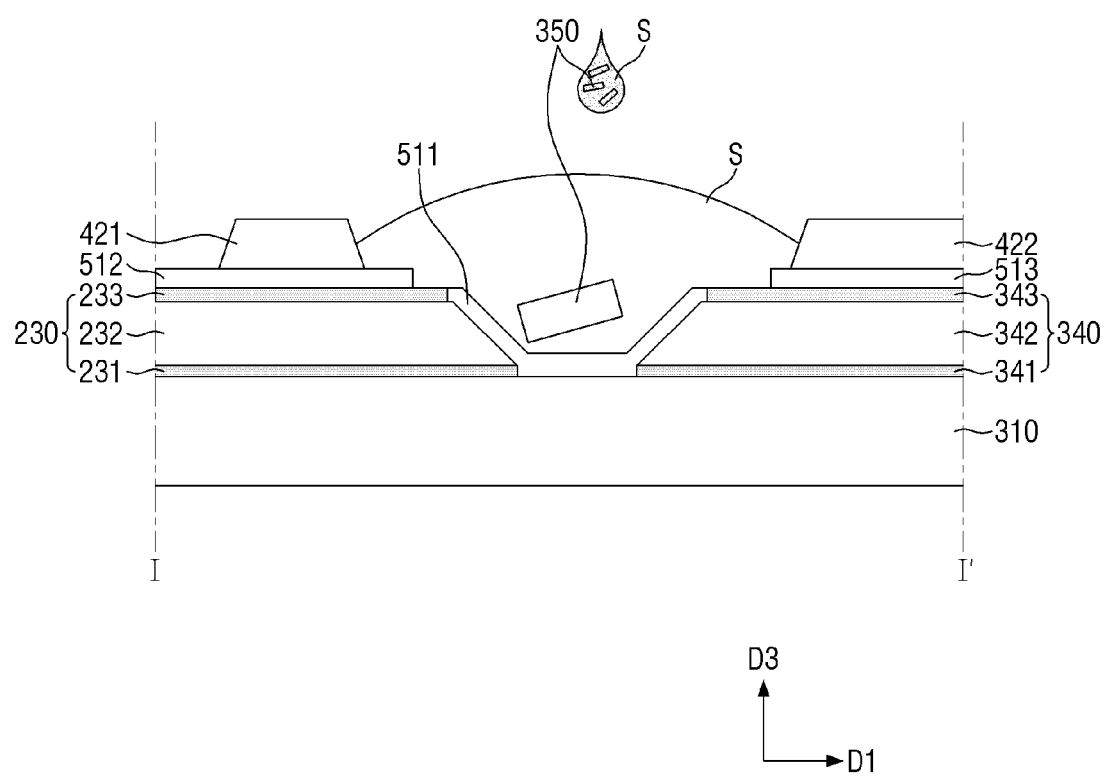

Pixel walls 421 and 422 may be formed on the fifth insulating layer 510. The pixel walls 421 and 422 may define boundaries between the pixels PX1, PX2, and PX3. Further, the pixel walls 421 and 422 may define a region in which a light-emitting element solution S (e.g., a solution including the light-emitting element 350), which will be described in FIG. 10, is disposed using an inkjet printing method and/or the like.

A first pixel wall 421 may be disposed on the second insulating pattern 512, and a second pixel wall 422 may be disposed on the third insulating pattern 513. The second pixel wall 422 may be omitted. In FIG. 2, the first pixel wall 421 is illustrated as being disposed to overlap the second insulating pattern 512, but the present disclosure is not limited thereto. For example, the first pixel wall 421 may be disposed to overlap an outer side surface of the first electrode 330.

The light-emitting element 350 may be disposed between the first electrode 330 and the second electrode 340. The light-emitting element 350 may emit light having a different color according to a material of an active material layer.

When different types or kinds of light-emitting elements are arranged in the pixels PX1, PX2, and PX3, the pixels PX1, PX2, and PX3 may emit pieces or beams of light having different colors. For example, the light-emitting element 350 emits light in a blue, green, or red wavelength band so that the pixels PX1, PX2, and PX3 may emit blue, green, and red light, respectively. However, the present disclosure is not limited thereto. In some cases, the light-emitting elements 350 may all emit light in the same color wavelength band so that the pixels PX1, PX2, and PX3 may be implemented to emit light having the same color (e.g., blue). Further, light-emitting elements that emit pieces or beams of light having different color wavelength bands may be disposed in one pixel (e.g., the first pixel PX1) to emit the pieces or beams of light having different colors (e.g., white).

The light-emitting element 350 may be an LED. The light-emitting element 350 may have a nanostructure having a size of a nano unit. The light-emitting element 350 may be an inorganic light-emitting diode made of an inorganic material. When the light-emitting element 350 is an inorganic light-emitting diode, a light-emitting material having an inorganic crystalline structure may be disposed between two electrodes facing each other, and when an electric field is formed in a set or specific direction on the light-emitting material, the inorganic light-emitting diodes may be arranged between the two electrodes having a set or specific polarity. An arrangement of the light-emitting elements 350 will be described below with reference to FIG. 11.

A sixth insulating layer 520 may be disposed on the light-emitting element 350 to protect the light-emitting element 350 and fix the light-emitting element 350 between the first electrode 330 and the second electrode 340. The sixth insulating layer 520 may also be disposed on an outer surface of the light-emitting element 350 to fix the light-emitting element 350. The sixth insulating layer 520 may be disposed in some regions of the outer surface of the light-emitting element 350 so that both side surfaces of the light-emitting element 350 may be exposed.

The sixth insulating layer 520 may include an insulating inorganic material. When the sixth insulating layer 520 is formed through a masking process, a defect (a seam) of an inorganic material crystal may be generated in the upper surface and an outer peripheral (e.g., circumferential) surface of the light-emitting element 350 and in a region adjacent to the light-emitting element 350. When a defect is generated in a region in which the light-emitting element 350 and the inorganic material layer are in contact with each other, the inorganic material layer may be excessively etched due to the defect during a subsequent masking process or, in some cases, the materials that are in contact with each other may be separated. Further, a gap may be formed between the light-emitting element 350 and the fourth insulating layer 310. Furthermore, when the inorganic material layer is deposited, the sixth insulating layer 520 may be non-uniformly formed on the light-emitting element 350 due to low step-coverage. Further, even in the case in which a first contact electrode 360 and a second contact electrode 370 are formed, when the step-coverage is low, the contact electrode material may be cut and the light-emitting element 350 may be electrically disconnected.

Accordingly, a seventh insulating layer 530 may be disposed on the sixth insulating layer 520. A cross section of the seventh insulating layer 530 may be disposed on a cross section of the sixth insulating layer 520, and the seventh insulating layer 530 may be disposed to cover at least a portion of an outer surface of the sixth insulating layer 520.

The seventh insulating layer 530 may fill a defect (a seam) that may be formed in the inorganic material layer such as the sixth insulating layer 520 or a gap that may be formed below the light-emitting element 350. Accordingly, the low step-coverage of the sixth insulating layer 520 may be eliminated or reduced and the disconnection of the contact electrode material may be prevented or reduced. Further, the sixth insulating layer 520 may be planarized by the seventh insulating layer 530. When an upper surface of the sixth insulating layer 520 is planarized by the seventh insulating layer 530, a subsequent process of forming the first contact electrode 360 and the second contact electrode 370 may be performed relatively smoothly.

A length of the seventh insulating layer 530 may be smaller than a length of the light-emitting element 350 and, in this case, the light-emitting element 350 and the seventh insulating layer 530 may be stacked in a stepped manner.

The first contact electrode 360 and the second contact electrode 370 may be disposed on the seventh insulating layer 530. The first contact electrode 360 may be disposed on the first electrode 330 and may overlap at least a portion of the seventh insulating layer 530. The second contact electrode 370 may be disposed on the second electrode 340, may be disposed to be spaced apart from the first contact electrode 360, and may be in contact with at least a portion of the seventh insulating layer 530.

The first contact electrode 360 and the second contact electrode 370 may be electrically connected to the first electrode 330 and the second electrode 340 which are partially exposed by the fifth insulating layer 510 (or the second insulating pattern 512, the third insulating pattern 513), respectively. The first contact electrode 360 and the second contact electrode 370 may be disposed on upper surfaces (e.g., upper surfaces exposed by the second insulating pattern 512 and the third insulating pattern 513) of the first electrode 330 and the second electrode 340, respectively. The first contact electrode 360 and the second contact electrode 370 may be in contact with the upper surfaces (and/or the side surface, the inclined surface) of the first electrode 330 and the second electrode 340, respectively. The first contact electrode 360 and the second contact electrode 370 may be in contact with the first semiconductor layer 351 and the second semiconductor layer 352 of the light-emitting element 350, respectively. Accordingly, the first contact electrode 360 and the second contact electrode 370 may transmit signals applied to the first electrode 330 and the second electrode 340 to the light-emitting element 350, respectively.

The first contact electrode 360 may be disposed on the first electrode 330 to cover the first electrode 330, and a lower surface of the first contact electrode 360 may be in partial contact with the light-emitting element 350 and the seventh insulating layer 530. One end portion of the first contact electrode 360 in a direction in which the second electrode 340 is disposed may be disposed on the seventh insulating layer 530. The second contact electrode 370 may be disposed on the second electrode 340 to cover the second electrode 340, and a lower surface of the second contact electrode 370 may be in partial contact with the light-emitting element 350, the seventh insulating layer 530, and an eighth insulating layer 540. One end portion of the second contact electrode 370 in a direction in which the first electrode 330 is disposed may be disposed on the eighth insulating layer 540.

The first contact electrode 360 and the second contact electrode 370 may be disposed on the seventh insulating layer 530 or the eighth insulating layer 540 to be spaced apart from each other. For example, the first contact electrode 360 and the second contact electrode 370 may be in contact with the light-emitting element 350 together with the seventh insulating layer 530 or the eighth insulating layer 540, but may not be connected by being spaced apart from each other on the seventh insulating layer 530. The first contact electrode 360 and the second contact electrode 370 may be physically spaced apart from each other and thus different voltages may be applied thereto. For example, an electrical signal (e.g., a driving voltage), which is applied from the first transistor 120 to the first electrode 330, may be applied to the first contact electrode 360 connected to the first electrode 330 through the fourth contact hole 319_1 passing through the fourth insulating layer 310, and a power voltage, which is applied from the power line 161 and the power electrode 162 to the second electrode 340, may be applied to the second contact electrode 370 connected to the second electrode 340 through the fifth contact hole 319_2 passing through the fourth insulating layer 310. However, the present disclosure is not limited thereto.

The first contact electrode 360 and the second contact electrode 370 may include a conductive material. For example, the first contact electrode 360 and the second contact electrode 370 may include indium tin oxide (ITO), indium zinc oxide (IZO), indium tin zinc oxide (ITZO), aluminum (Al), and/or the like. However, the present disclosure is not limited thereto.

The first contact electrode 360 and the second contact electrode 370 may be disposed on the first electrode 330 and the second electrode 340 in substantially the same pattern so as to be in contact with the first electrode 330 and the second electrode 340.

The eighth insulating layer 540 may be disposed above the first contact electrode 360, may physically separate the first contact electrode 360 from the second contact electrode 370, and may prevent or reduce direct contact of the first contact electrode 360 and the second contact electrode 370 with each other. The eighth insulating layer 540 may be disposed to cover the first contact electrode 360 and may be disposed so as not to overlap a region of the light-emitting element 350 so that the light-emitting element 350 may be connected to the second contact electrode 370. On an upper surface of the seventh insulating layer 530, the eighth insulating layer 540 may be in partial contact with the first contact electrode 360 and the seventh insulating layer 530. The eighth insulating layer 540 may be disposed on the upper surface of the seventh insulating layer 530 to cover one end portion of the first contact electrode 360. Accordingly, the eighth insulating layer 540 may protect the first contact electrode 360 and, at the same time, may prevent or reduce direct contact of the first contact electrode 360 with the second contact electrode 370.

One end portion of the eighth insulating layer 540 in the direction in which the second electrode 340 is disposed may be disposed to cover the seventh insulating layer 530 and may be aligned with one side surface of the sixth insulating layer 520.

The eighth insulating layer 540 may be omitted. Accordingly, the first contact electrode 360 and the second contact electrode 370 may be disposed to be substantially coplanar, and the first contact electrode 360 and the second contact electrode 370 may be physically separated from each other by a passivation layer 550 to be described below and may not be directly connected to each other.

The passivation layer 550 may be formed above the eighth insulating layer 540 and the second contact electrode 370 and may function to protect the members disposed on the fourth insulating layer 310 from an external environment. When the first contact electrode 360 and the second contact electrode 370 are exposed, because a disconnection problem of the contact electrode material may occur due to damage to the electrodes, the first contact electrode 360 and the second contact electrode 370 may be covered with the passivation layer 550. For example, the passivation layer 550 may be disposed to cover the first electrode 330, the second electrode 340, the light-emitting element 350, and/or the like. Further, when the eighth insulating layer 540 is omitted, the passivation layer 550 may be formed above the first contact electrode 360 and the second contact electrode 370. In this case, the passivation layer 550 may electrically insulate the first contact electrode 360 from the second contact electrode 370.

In an embodiment, each of the fifth insulating layer 510, the sixth insulating layer 520, the eighth insulating layer 540, and the passivation layer 550 may include an inorganic insulating material. For example, the fifth insulating layer 510, the sixth insulating layer 520, the eighth insulating layer 540, and the passivation layer 550 may include a material such as silicon oxide ($SiO_x$), silicon nitride ($SiN_x$), silicon oxynitride ($SiO_xN_y$), aluminum oxide ($Al_2O_3$), aluminum nitride (AlN), and/or the like. The fifth insulating layer 510, the sixth insulating layer 520, the eighth insulating layer 540, and the passivation layer 550 may be made of the same material but may be made of different materials. In addition, various suitable materials that impart insulation may be applied to the fifth insulating layer 510, the sixth insulating layer 520, the eighth insulating layer 540, and the passivation layer 550.

Meanwhile, the fifth insulating layer 510, the eighth insulating layer 540, and the passivation layer 550 may further include an organic insulating material like the seventh insulating layer 530. However, the present disclosure is not limited thereto. Any suitable material may be used as the organic insulating material included in the seventh insulating layer 530 without any particular limitation as long as the material is within a range that does not affect the characteristics of the light-emitting element solution S. For example, the organic insulating material may include at least one selected from the group consisting of an epoxy resin, a cardo resin, a polyimide resin, an acrylic resin, a siloxane resin, and a silsesquioxane resin, but the present disclosure is not limited thereto.

As described in with reference to FIG. 2, the light-emitting device 10 may include the first electrode 330 and the second electrode 340, which are made of a reflective material and have thick and inclined surfaces, and may include the light-emitting element 350 disposed between the first electrode 330 and the second electrode 340. For example, the first electrode 330 and the second electrode 340 may be formed as an integrated reflective electrode instead of including separate walls, electrodes, reflective electrodes, and/or the like, and thus a manufacturing process of the light-emitting device 10 may be more simplified.

Further, the first electrode 330 and the second electrode 340 may be formed to be relatively thick so that resistance values thereof may be relatively reduced. Accordingly, the drop of the electrical signal (e.g., the power for aligning the light-emitting elements 350 or the data signal for displaying the image) applied to the first electrode 330 and the second electrode 340 may be prevented or reduced and the light emission efficiency (or the alignment efficiency of the light-emitting element 350) and display quality of the light-emitting device 10 may be improved.

Figure 3:
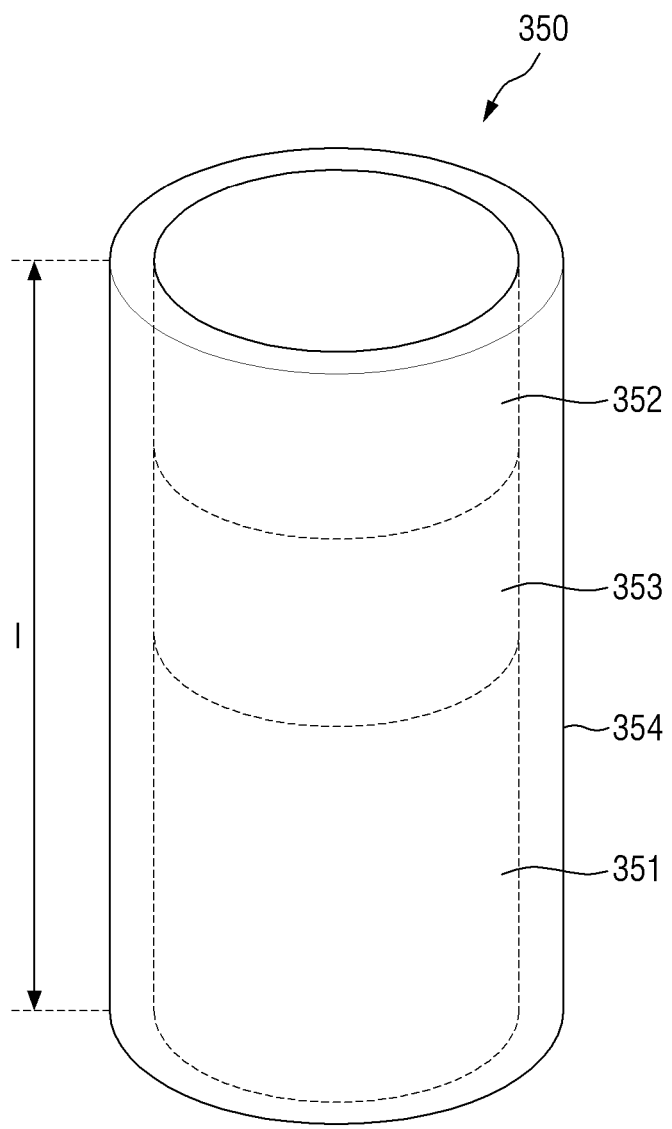
FIG. 3 is a view illustrating an example of a light-emitting element included in the light-emitting device of FIG. 1.

FIG. 3 is a view illustrating an example of the light-emitting element included in the light-emitting device of FIG. 1.

Referring to FIG. 3, a light-emitting element 350 may include semiconductor layers 351 and 352 and an active material layer 353 disposed between the semiconductor layers 351 and 352. Further, the light-emitting element 350 may further include an insulating material layer 354. Electrical signals applied from the first electrode 330 and the second electrode 340 may be transmitted to the active material layer 353 through the semiconductor layers 351 and 352 to emit light.

A first semiconductor layer 351 may be an N-type semiconductor layer. For example, when the light-emitting element 350 emits light in a blue wavelength band, the first semiconductor layer 351 may be a semiconductor material having a chemical formula of $In_xAl_yGa_{1-x-y}N$ ($0 \leq x \leq 1$, $0 \leq y \leq 1$, $0 \leq x+y \leq 1$). For example, the first semiconductor layer 351 may be any one or more of N-type doped InAlGaN, GaN, AlGaN, InGaN, AlN, and InN. The first semiconductor layer 351 may be doped with a first conductive dopant, and the first conductive dopant may be, for example, Si, Ge, Sn, and/or the like. The first semiconductor layer 351 may have a length in a range of 1.5 µm to 5 µm, but the present disclosure is not limited thereto.

A second semiconductor layer 352 may be a P-type semiconductor layer. For example, when the light-emitting element 350 emits light in a blue wavelength band, the second semiconductor layer 352 may be a semiconductor material having a chemical formula of $In_xAl_yGa_{1-x-y}N$ ($0 \leq x \leq 1$, $0 \leq y \leq 1$, $0 \leq x+y \leq 1$). For example, the second semiconductor layer 352 may be any one or more of P-type doped InAlGaN, GaN, AlGaN, InGaN, AlN, and InN. The second semiconductor layer 352 may be doped with a second conductive dopant and the second conductive dopant may be, for example, Mg, Zn, Ca, Se, Ba, and/or the like. The second semiconductor layer 352 may have a length in a range of 0.08 µm to 0.25 µm, but the present disclosure is not limited thereto.

The active material layer 353 may be disposed between the first semiconductor layer 351 and the second semiconductor layer 352 and may include a material having a single or multiple quantum well structure. However, the present disclosure is not limited thereto, and the active material layer 353 may have a structure in which a semiconductor material having a high band gap energy and a semiconductor material having a low band gap energy are alternately stacked.

The active material layer 353 may emit light by combination of an electron-hole pair according to the electrical signals applied through the first semiconductor layer 351 and the second semiconductor layer 352. For example, when the active material layer 353 emits light in a blue wavelength band, the active material layer 353 may include a material such as AlGaN, AlInGaN, and/or the like, and may include other group III to group V semiconductor materials according to the wavelength band of the emitted light. Accordingly, the light emitted from the active material layer 353 is not limited to the light in the blue wavelength band and, in some cases, light in a red or green wavelength band may be emitted. The active material layer 353 may have a length in a range of 0.05 µm to 0.25 µm, but the present disclosure is not limited thereto.

The light emitted from the active material layer 353 may be emitted not only to an outer surface of the light-emitting element 350 in a longitudinal direction, but also to both side surfaces. For example, the light emitted from the active material layer 353 is not limited in directionality to one direction.

The insulating material layer 354 may be formed at outer side of the light-emitting element 350 to protect the light-emitting element 350. For example, the insulating material layer 354 may be formed to surround the side surface of the light-emitting element 350 and may not be formed on both end portions of the light-emitting element 350 in the longitudinal direction, for example, both end portions of the first semiconductor layer 351 and the second semiconductor layer 352. However, the present disclosure is not limited thereto. The insulating material layer 354 may include material having insulating properties, for example, silicon oxide ($SiO_x$), silicon nitride ($SiN_x$), silicon oxynitride ($SiO_xN_y$), aluminum nitride (AlN), aluminum oxide ($Al_2O_3$), and/or the like. Accordingly, an electrical short that may occur when the active material layer 353 is brought into direct contact with the first electrode 330 or the second electrode 340 may be prevented or reduced. Further, because the insulating material layer 354 protects the outer surface of the light-emitting element 350 as well as the active material layer 353, a decrease in light emission efficiency may be prevented or reduced.

The insulating material layer 354 may have a thickness in a range of 0.5 µm to 1.5 µm, but the present disclosure is not limited thereto.

The light-emitting element 350 may have a cylindrical shape. However, the shape of the light-emitting element 350 is not limited thereto, and the light-emitting element 350 may have various suitable shapes such as a cubic shape, a rectangular parallelepiped shape, a hexagonal column shape, and/or the like. The light-emitting element 350 may have a length in a range of 1 µm to 10 µm or a range of 2 µm to 5 µm, and, for example, may have a length of about 4 µm. Further, the light-emitting element 350 may have a diameter in a range of 400 nm to 700 nm, and, for example, may have a thickness of about 500 nm.

In some embodiments, the light-emitting element 350 may further include an electrode layer on at least one of both side surfaces on which the first semiconductor layer 351 and the second semiconductor layer 352 are disposed. In this case, the insulating material layer 354 may be formed to extend in a longitudinal direction so as to cover the electrode layer. However, the present disclosure is not limited thereto, and the insulating material layer 354 may cover only the first semiconductor layer 351, the active material layer 353, and the second semiconductor layer 352 or may cover only a portion of an outer surface of the electrode layer so that some portions of the outer surface of the electrode layer may be exposed.

The electrode layer may be an ohmic contact electrode. However, the present disclosure is not limited thereto, and the electrode layer may be a Schottky contact electrode. The electrode layer may include a conductive metal. For example, the electrode layer may include at least one selected from aluminum (Al), titanium (Ti), indium (In), gold (Au), and silver(Ag).

FIGS. 4 to 18 are views illustrating a method of manufacturing the light-emitting device of FIG. 1.

Figure 4:
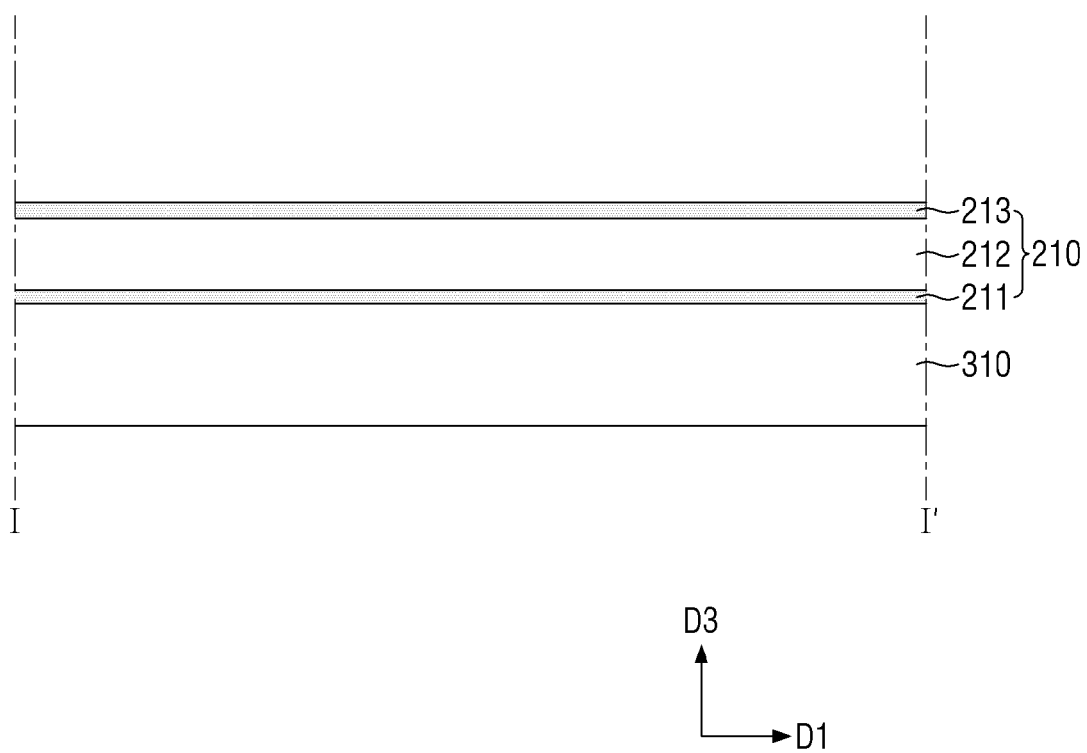
FIGS. 4 to 18 are views illustrating a method of manufacturing the light-emitting device of FIG. 1.

First, referring to FIGS. 1, 2, and 4, a circuit board 100 is provided. In FIG. 4, only a fourth insulating layer 310 of the circuit board 100 is illustrated but, for convenience of description, a substrate 110, transistors 120 and 140, a power line 161, and the like are omitted, and the configuration of the circuit board 100 described with reference to FIG. 2 may be applied to a configuration of the circuit board 100 in FIGS. 4 to 18 without change.

Subsequently, an unseparated mother electrode 210 is formed on the circuit board 100. The mother electrode 210 is an entire unseparated electrode formed over an entirety of one surface of the circuit board 100 and is an electrode which will be separated by patterning thereafter to become a plurality of first electrodes and a plurality of second electrodes. A plurality of fourth contact holes (319_1 in FIG. 2) and a plurality of fifth contact holes (319_2 in FIG. 2) are already formed in the circuit board 100 so that the mother electrode 210 may be electrically connected to a first drain electrode 123 of a first transistor 120 and a power electrode 162 through the fourth contact holes 319_1 and the fifth contact holes 319_2.

The mother electrode 210 may include a first metal bonding layer 211, a metal conductive layer 212, and a second metal bonding layer 213. Here, the first metal bonding layer 211, the metal conductive layer 212, and the second metal bonding layer 213 may be substantially the same as the first metal bonding layer 331, the metal conductive layer 332, and the second metal bonding layer 333 described with reference to FIG. 2, respectively.

Figure 5:
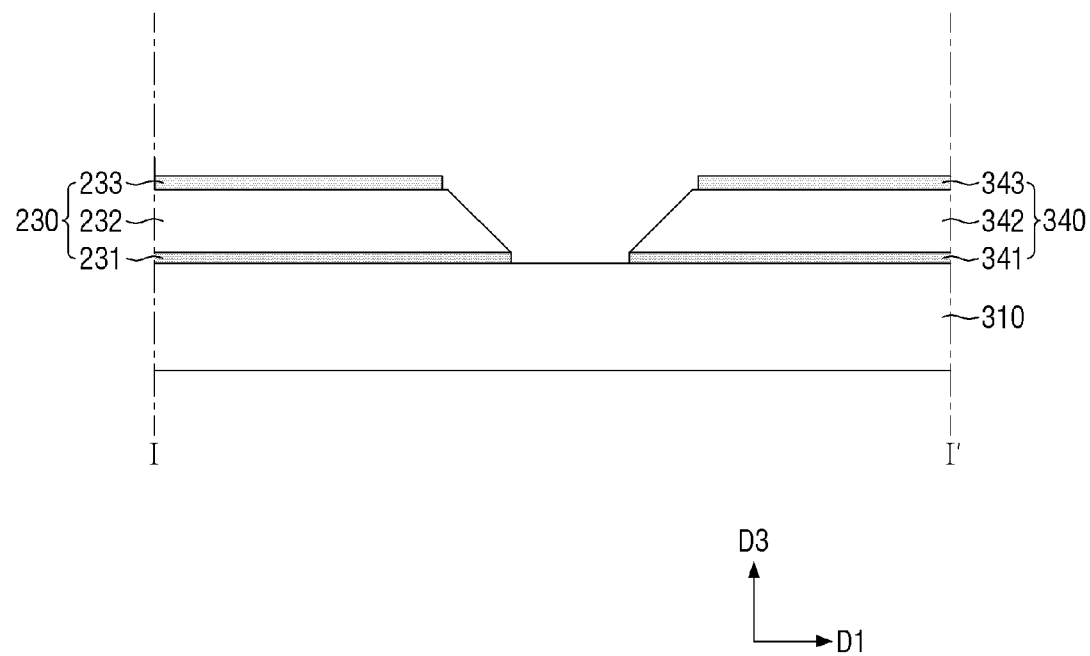
Figure 6:
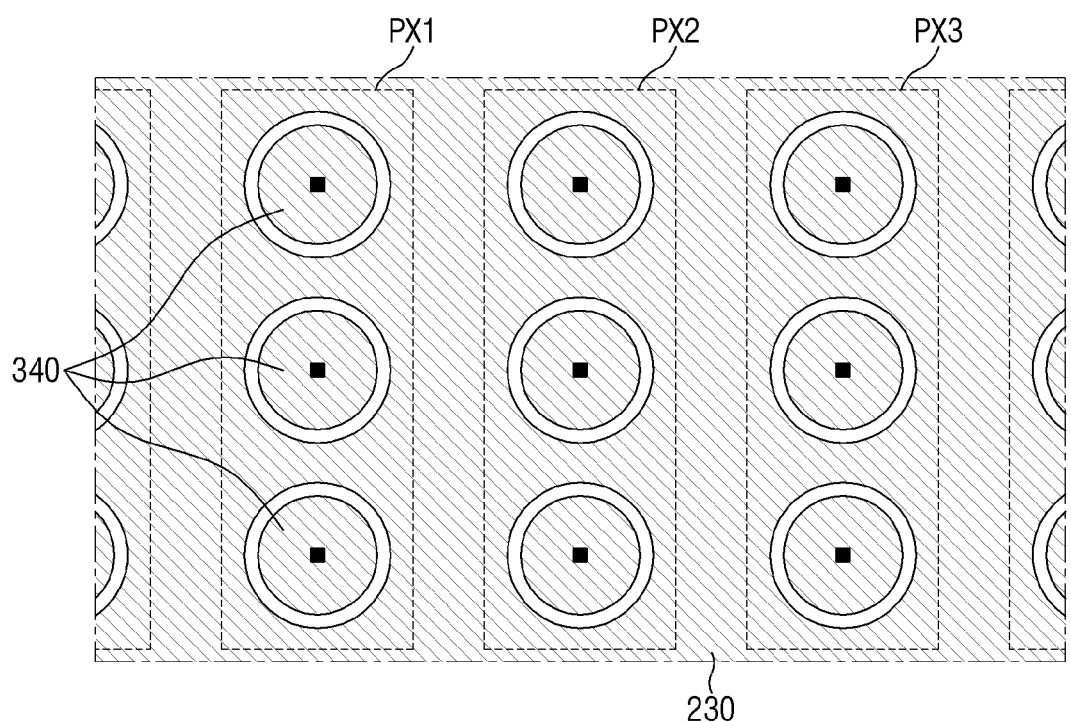
Figure 6:
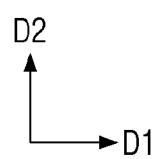

Subsequently, as illustrated in FIG. 5, the mother electrode 210 is patterned to form a plurality of second electrodes 340 and an unseparated electrode pattern 230. The unseparated electrode pattern 230 is a residual electrode pattern remaining after a plurality of second electrodes 340 are formed from the mother electrode 210, and are an electrode pattern which will be separated to become a plurality of first electrodes 330. FIG. 6 is a plan view corresponding to FIG. 5. As illustrated in FIG. 6, the unseparated electrode pattern 230 may have a shape of one electrode pattern which surrounds the second electrode 340 and is disposed over the circuit board 100 (e.g., which is not divided for each of pixels PX1, PX2, and PX3). In an embodiment, the unseparated electrode pattern 230 may have a mesh structure.

Among the first and second electrodes 330 and 340 described with reference to FIGS. 1 and 2, only the second electrode 340 (and the unseparated electrode pattern 230) required for alignment of the light-emitting elements 350 may be, for example, patterned or formed.

As described with reference to FIG. 2, the second electrode 340 may have a tapered shape and the unseparated electrode pattern 230 may also have a tapered shape. The second electrode 340 may have a taper angle of 60 degrees or less, and the unseparated electrode pattern 230 formed by patterning from the same mother electrode 210 may have the same taper angle as the taper angle of the second electrode 340.

Figure 7:
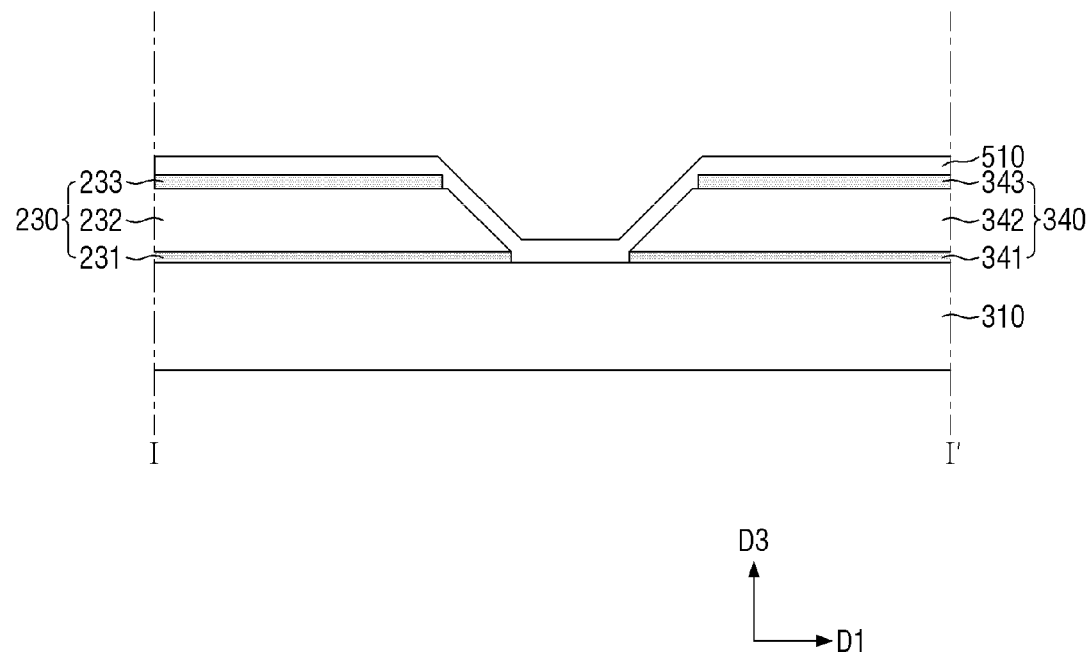

Subsequently, as illustrated in FIG. 7, a fifth insulating layer 510 is formed to cover the second electrode 340 and the unseparated electrode pattern 230.

Figure 8:
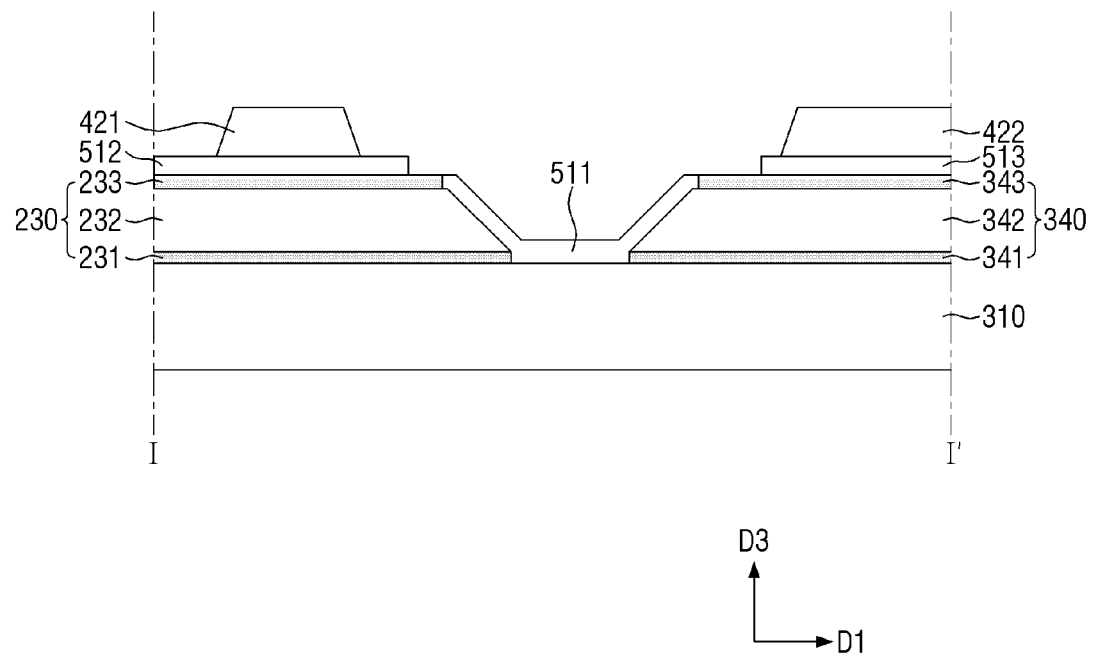

Subsequently, referring to FIG. 8, a pixel wall 420 is formed on the fifth insulating layer 510, and the fifth insulating layer 510 is patterned to form a first insulating pattern 511, a second insulating pattern 512, and a third insulating pattern 513. The patterning of the fifth insulating layer 510 may be performed after the pixel wall 420 is formed, or after the fifth insulating layer 510 is first patterned, the pixel wall 420 may be formed.

Figure 9:
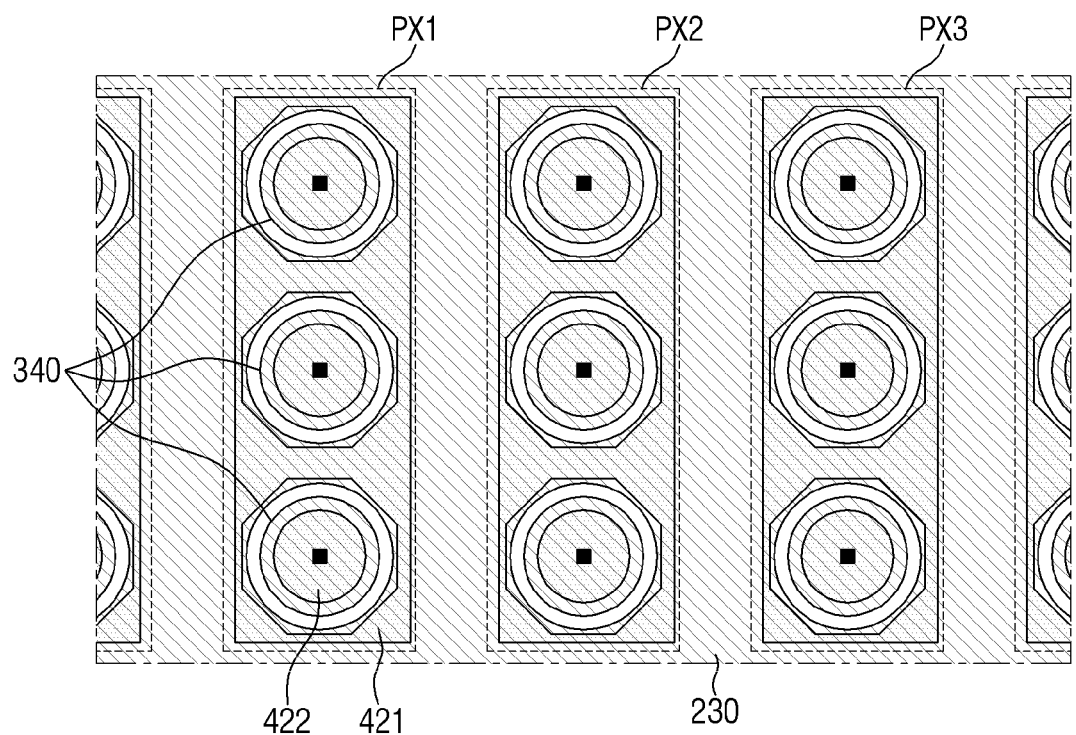

The pixel wall 420 may include a first pixel wall 421 and a second pixel wall 422. The first pixel wall 421 may be formed on the second insulating pattern 512 formed on the unseparated electrode pattern 230, and the second pixel wall 422 may be formed on the third insulating pattern 513 formed on the second electrode 340. FIG. 9 is a plan view corresponding to FIG. 8. As illustrated in FIG. 9, the first pixel wall 421 may be disposed to overlap a region of the unseparated electrode pattern 230 in which the first electrode 330 is formed. For example, the first pixel wall 421 may be disposed in a region of each of the pixels PX1, PX2, and PX3.

In some embodiments, the first pixel wall 421 may also be disposed between the second electrodes 340 adjacent to each other in a second direction D2. In one or more embodiments, the first pixel wall 421 may be disposed along the periphery (or adjacent to the periphery) of each of the holes HOL1, HOL2, and HOL3 described with reference to FIG. 1. For example, when the first pixel PX1 includes the second electrode 340, the first pixel wall 421 may be disposed along an edge of the first pixel PX1. As another example, when the first pixel PX1 includes a plurality of second electrodes 340, the first pixel wall 421 may regions in which the second electrodes 340 are disposed and may also be disposed between the adjacent second electrodes 340.

In one or more embodiments, the first pixel wall 421 may have a planar shape that is substantially the same as or similar to the planar shape of the first electrode 330 described with reference to FIG. 1, and may include bank holes corresponding to the holes HOL1, HOL2, and HOL3 of the first electrode 330.

In this case, a light-emitting element solution S, which will be described below, may be disposed only inside the bank holes, and thus manufacturing costs of the light-emitting device 10 may be reduced.

Meanwhile, in FIG. 9, the bank holes of the first pixel wall 421 are illustrated as having an octagonal planar shape, but the above configuration is an example and the present disclosure is not limited thereto. For example, the bank holes of the first pixel wall 421 may have a planar shape, such as a circular shape, a tetragonal shape, a hexagonal shape, an elliptical shape, a rectangular shape, and/or the like, in a range wider than that of the holes HOL1, HOL2, and HOL3 of the first electrode 330.

Similarly, the second pixel wall 422 has a shape similar to the planar shape of the second electrode 340, but the present disclosure is not limited thereto. The second pixel wall 422 may be omitted.

Referring to FIG. 10, after the pixel walls 420 are formed, the light-emitting element solution S including the light-emitting element 350 is loaded on the circuit board 100, and the light-emitting element 350 is disposed between the pixel walls 420 (or between the unseparated electrode pattern 230 and the second electrode 340). Here, the light-emitting element solution S may have a formulation such as ink or paste, and may include any one or more of acetone, water, alcohol, and toluene. However, the present disclosure is not limited thereto, and any suitable material that may be vaporized at room temperature or by heat may be used without any particular limitation.

In this case, the light-emitting element solution S may be brought into contact with the pixel walls 420 and may maintain a hemispherical shape due to surface tension of the light-emitting element solution S. A force may be applied to a region, in which the light-emitting element solution S is brought into contact with the pixel walls 420, in a central direction of the light-emitting element solution S, and the light-emitting element solution S may not overflow from the pixel walls 420. Accordingly, movement of the light-emitting element 350 to another adjacent pixel may be prevented or reduced.

Figure 11:
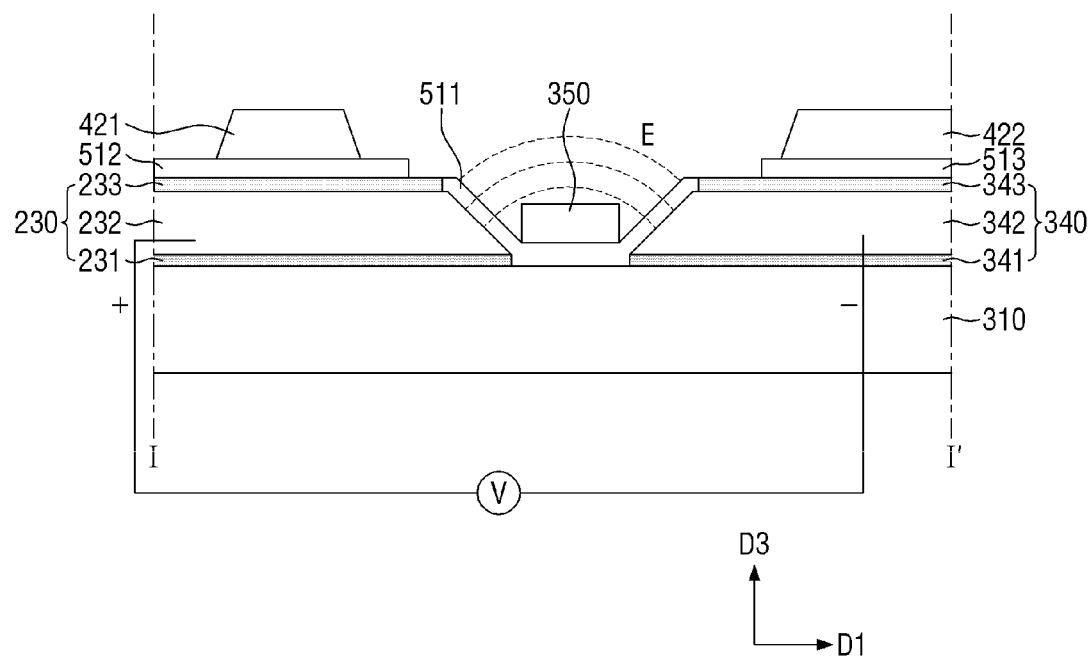

Referring to FIG. 11, after the light-emitting element 350 is disposed, alternating current (AC) power may be applied to the light-emitting element 350 and the light-emitting element 350 may be aligned using dielectrophoresis (DEP).

When a power source V applies power to the unseparated electrode pattern 230 and the second electrode 340, an electric field E may be formed between the unseparated electrode pattern 230 and the second electrode 340. Here, the power source V may be an external supply source or internal power source of the light-emitting device 10. The power source V may supply AC power or direct current (DC) power having a set or predetermined amplitude and period. DC power may be repeatedly applied to the unseparated electrode pattern 230 and the second electrode 340 so that power having a set or predetermined amplitude and period may be realized.

Bipolarity is induced in the light-emitting element 350 under the electric field E, and the light-emitting element 350 is subjected to a force toward a larger or smaller inclination of the electric field E due to a DEP force. The light-emitting element 350 may be self-aligned between the unseparated electrode pattern 230 and the second electrode 340 due to the DEP force.

After the light-emitting element 350 is aligned, the light-emitting element solution S is vaporized and removed at room temperature or by heat so that the light-emitting element 350 may be disposed between the unseparated electrode pattern 230 and the second electrode 340.

Figure 12:
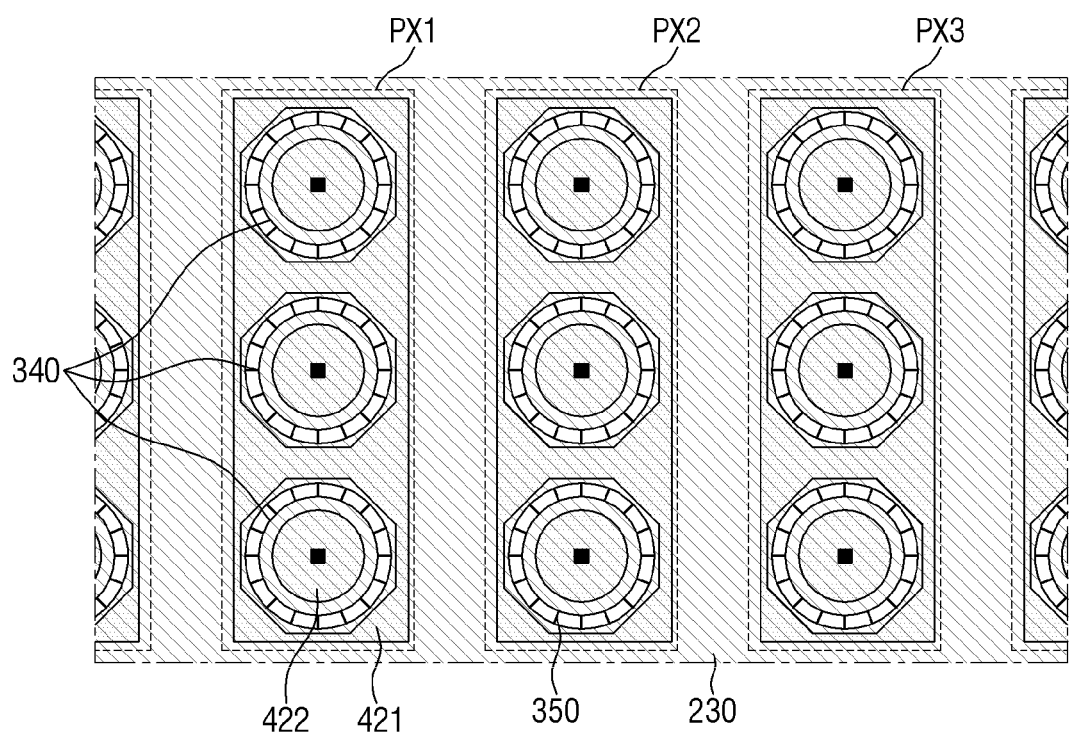
Figure 12:
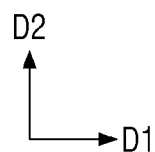

FIG. 12 is a plan view corresponding to FIG. 11, and the light-emitting elements 350 may be arranged or aligned relatively uniformly. The unseparated electrode pattern 230 is not divided for each of the pixels PX1, PX2, and PX3, and has a mesh structure as a whole as illustrated in FIG. 9, and thus a resistance value of the unseparated electrode pattern 230 may be very small compared to the first electrode 330 after being separated into individual electrodes. For example, a voltage drop due to the unseparated electrode pattern 230 may be very small. Accordingly, the power applied to align the light-emitting element 350 may be uniformly (e.g., substantially uniformly) applied for each of the pixels PX1, PX2, and PX3, and further, may be uniformly (e.g., substantially uniformly) applied for each region in the pixel (e.g., a region adjacent to each second electrode 340), and a very uniform electric field E may be formed between the unseparated electrode pattern 230 and the second electrode 340. Therefore, the light-emitting element 350 may be arranged relatively uniformly with a uniform (e.g., substantially uniform) direction due to the uniform (e.g., substantially uniformly) electric field E so that the light emission efficiency and display quality of the light-emitting device 10 may be improved.

In an embodiment, the light-emitting element solution S may include at least one type or kind of light-emitting element 350. In order to align the light-emitting elements 350 that emit pieces or beams of light having different colors in the pixels PX1, PX2, and PX3 of the light-emitting device 10, the light-emitting element solution S may include light-emitting elements 350 that emit the pieces or beams of light having various suitable colors. Further, the light-emitting elements 350 that emit the pieces or beams of light having different colors may be mixed in the light-emitting element solution S. However, the present disclosure is not limited thereto.

Figure 13:
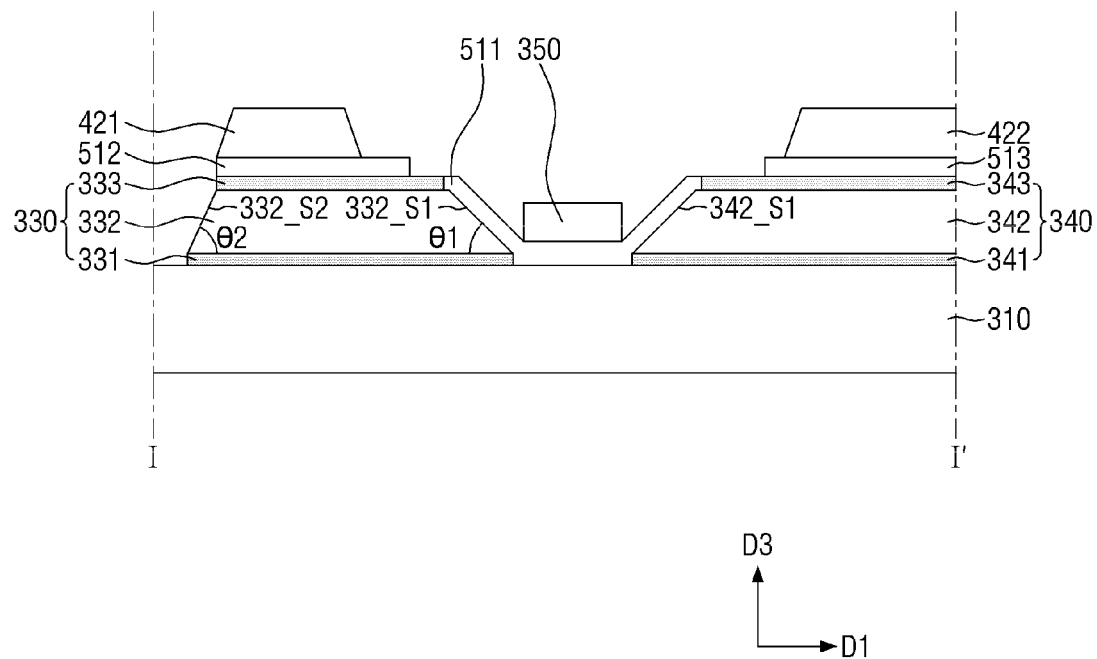

Referring to FIG. 13, after the light-emitting elements 350 are aligned, a plurality of first electrodes 330 are formed by performing a patterning process on the unseparated electrode pattern 230. When the patterning process of the first electrode 330 is performed in the same process as the process of forming the second electrode 340 described with reference to FIGS. 5 and 6, a second inclination angle of a second inclined surface (e.g., an outer side surface adjacent to or facing another first electrode) of the first electrode 330 may be substantially the same as a first inclination angle of a first inclined surface (e.g., an inner side surface adjacent to or facing a second electrode 340) of the first electrode 330.

However, because the first electrode 330 is formed at a time point different from a time point at which the second electrode 340 is formed, environmental factors that cannot be controlled through process equipment may vary. Accordingly, the second inclination angle of the second inclined surface of the first electrode 330 may be different from the first inclination angle of the first inclined surface. Further, because the second inclined surface of the first electrode 330 is not in direct contact with the light-emitting element 350 and does not function as a reflective electrode, the second inclination angle of the second inclined surface of the first electrode 330 may not need to be limited to a range of the first inclination angle of the first inclined surface. Furthermore, as the second inclination angle of the second inclined surface of the first electrode 330 decreases, separation distances between the pixels PX1, PX2, and PX3 increase and thus, as the second inclination angle of the second inclined surface of the first electrode 330 increases, the density of the pixels PX1, PX2, and PX3 may increase. Therefore, the second inclination angle of the second inclined surface of the first electrode 330 may be different from the first inclination angle of the first inclined surface and, for example, the second inclination angle of the second inclined surface of the first electrode 330 may be greater than the first inclination angle of the first inclined surface.

Figure 14:
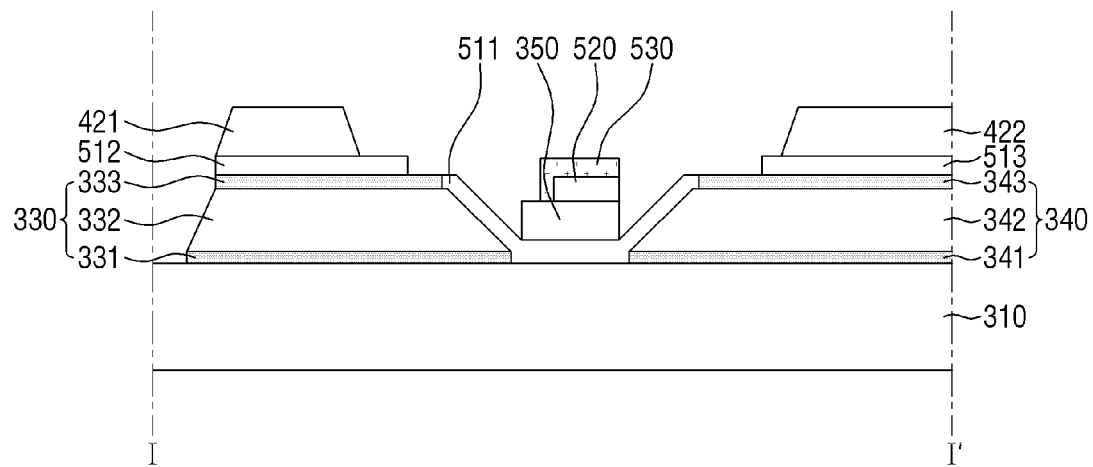

After the first electrode 330 is patterned, a sixth insulating layer 520 and a seventh insulating layer 530 are formed on the light-emitting element 350 as illustrated in FIG. 14.

Figure 15:
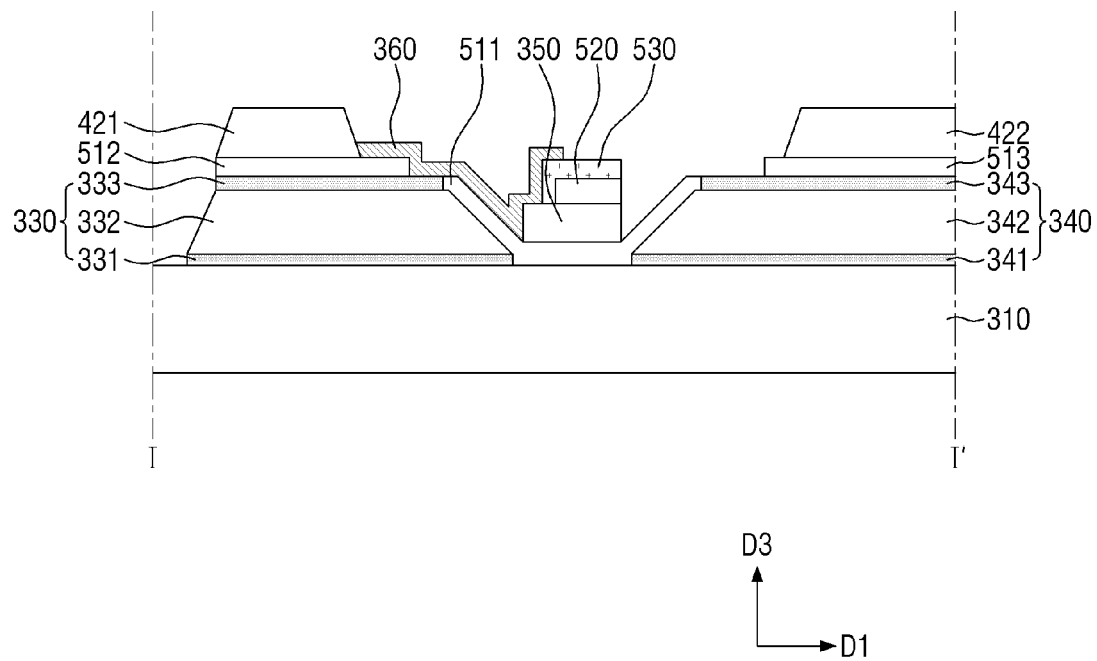

Thereafter, as illustrated in FIG. 15, a first contact electrode 360 is formed on the first electrode 330. The first contact electrode 360 is formed to cover the first electrode 330, and some regions of the first contact electrode 360 may be in contact with the light-emitting element 350 and the seventh insulating layer 530.

Figure 16:
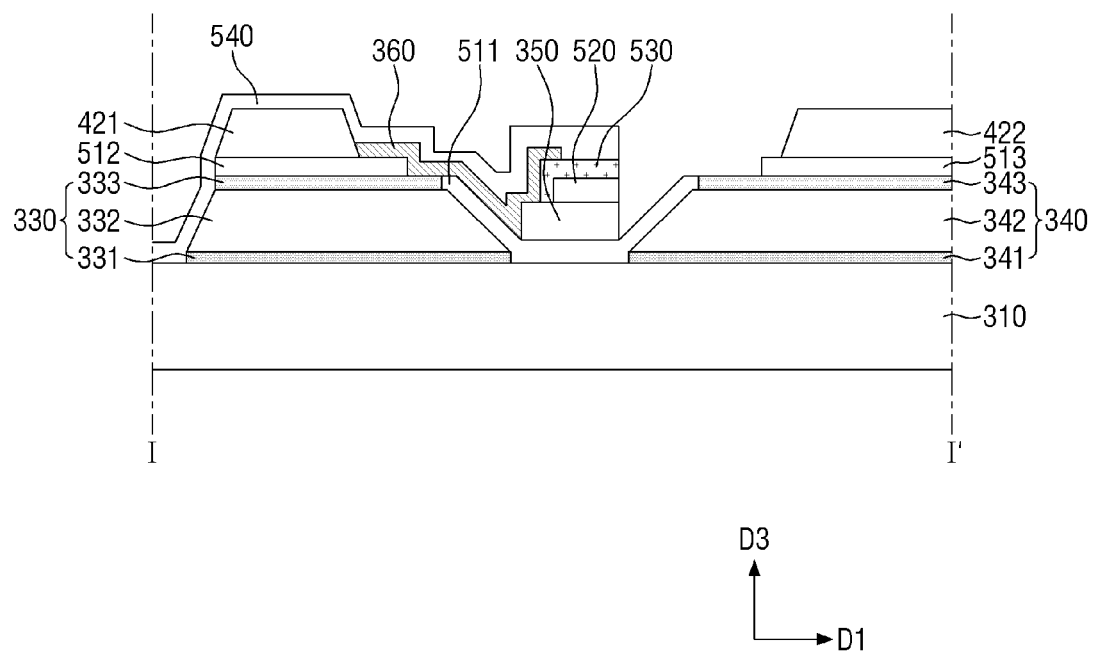

Referring to FIG. 16, subsequently, an eighth insulating layer 540 is formed on the first contact electrode 360. The eighth insulating layer 540 may be formed to cover the first contact electrode 360 and expose the second electrode 340. The eighth insulating layer 540 may cover one end portion (e.g., one end portion in a direction in which the second electrode 340 is disposed) of the first contact electrode 360, and may cover one side surface (e.g., one side surface in the direction in which the second electrode 340 is disposed) of the seventh insulating layer 530.

Figure 17:
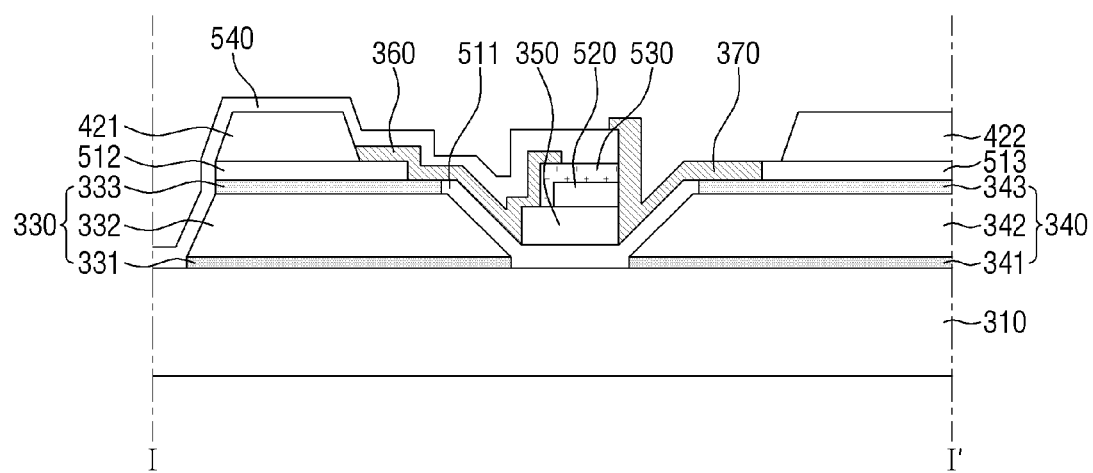

Referring to FIG. 17, subsequently, a second contact electrode 370 is formed on an upper surface of the second electrode 340. The second contact electrode 370 may be in partial contact with the second electrode 340, the light-emitting element 350, the seventh insulating layer 530, and the eighth insulating layer 540. The second contact electrode 370 may be formed even on some regions of an upper portion of the eighth insulating layer 540. By the eighth insulating layer 540, the second contact electrode 370 may be physically separated from the first contact electrode 360 and direct contact of the second contact electrode 370 with the first contact electrode 360 may be prevented or reduced.

Figure 18:
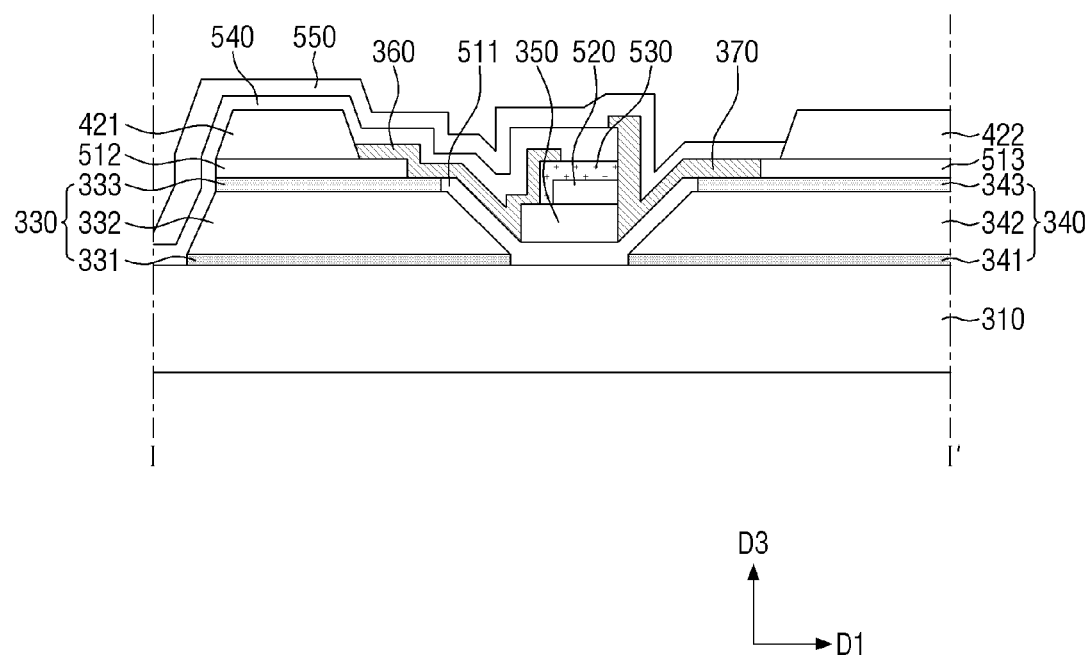

Thereafter, as illustrated in FIG. 18, a passivation layer 550 may be formed to cover the eighth insulating layer 540 and the second contact electrode 370.

The light-emitting device 10 may be manufactured through a series of processes described with reference to FIGS. 14 to 18. In the manufacturing process of the light-emitting device 10, all of the first electrode 330 and second electrodes 340 having an inclined surface are formed from one mother electrode 210, and thus the manufacturing process of the light-emitting device 10 may be simplified compared to the manufacturing process of the light-emitting device including separate walls, electrodes, reflective electrodes, and/or the like.

Further, the light-emitting elements 350 are aligned in a state in which only the second electrode 340 is patterned, and thus the alignment efficiency of the light-emitting element 350 and the light emission efficiency and display quality of the light-emitting device 10 may be improved.

Furthermore, the pixel wall 420 is formed to separate not only the pixels PX1, PX2, and PX3, but also the respective second electrodes 340, and thus, provision of the light-emitting solution S to unnecessary regions may be prevented or reduced and the manufacturing costs of the light-emitting device 10 may be reduced.

Figure 19:
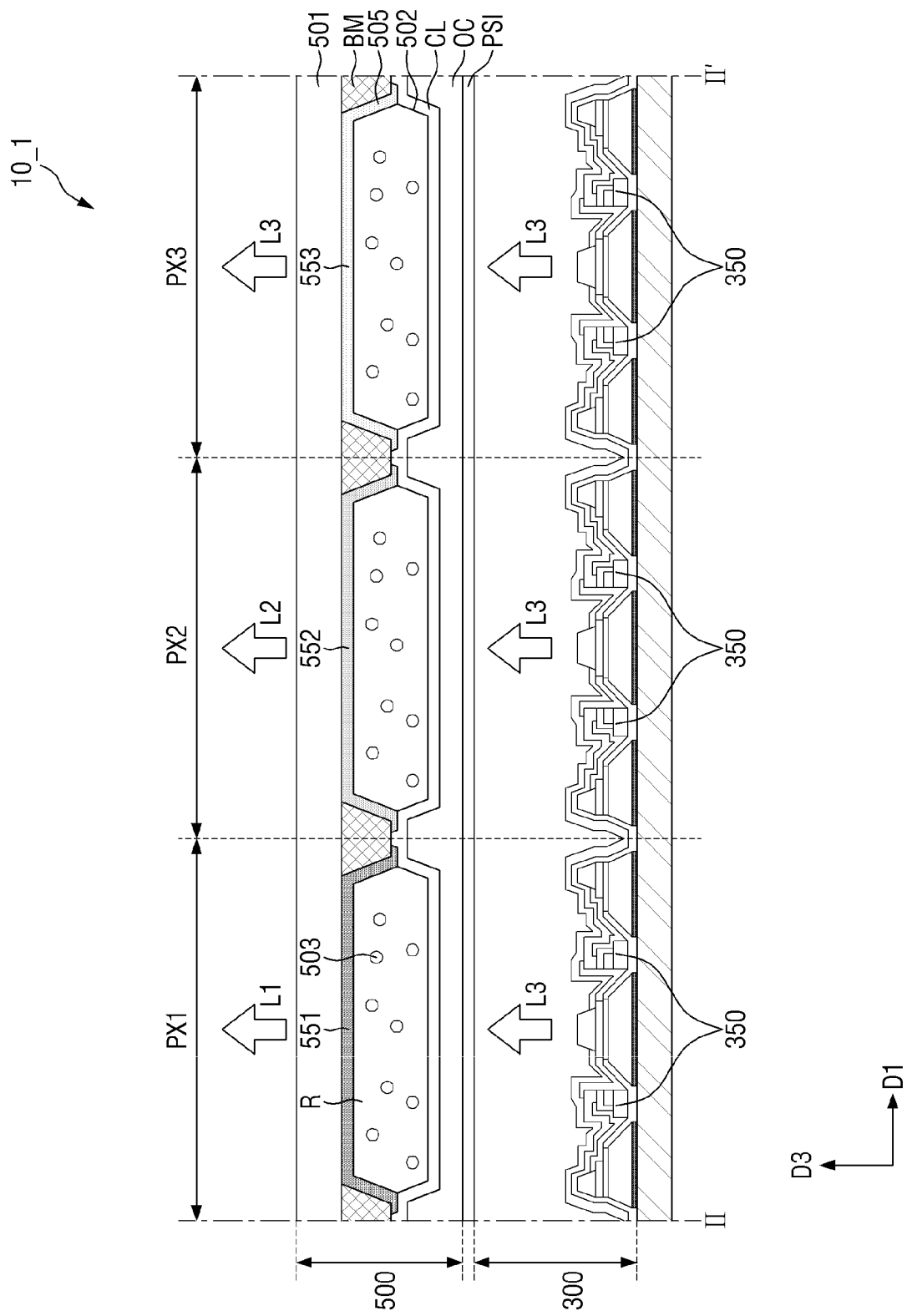
FIG. 19 is a cross-sectional view illustrating an example of the light-emitting device taken along line II-II' of FIG. 1.

FIG. 19 is a cross-sectional view illustrating an example of the light-emitting device taken along line II-II' of FIG. 1.

Referring to FIGS. 1, 2, and 19, a light-emitting device 10_1 may include pixels PX1, PX2, and PX3, and may include a light-emitting element layer 300 constituting the pixels PX1, PX2, and PX3 and a color conversion unit 500.

The pixels PX1, PX2, and PX3 may emit pieces or beams of light having different colors. For example, a first pixel PX1 may emit light having a first color L1, the second pixel PX2 may emit light having a second color L2, and the third pixel PX3 may emit light having a third color L3. However, the present disclosure is not limited thereto and, in some cases, adjacent pixels may emit light having the same color.

In an embodiment, a central wavelength band of the first color L1 is longer than a central wavelength band of the second color L2, and the central wavelength band of the second color L2 is longer than a central wavelength band of the third color L3. For example, the first color L1 may be a red color having a central wavelength band in a range of about 610 nm to 650 nm, the second color L2 may be a green color having a central wavelength band in a range of about 530 nm to 570 nm, and the third color L3 may be a blue color having a central wavelength band in a range of about 430 nm to 470 nm. However, the present disclosure is not limited thereto, and the first color L1, the second color L2, and the third color L3 are not particularly limited in a range having different central wavelength bands.

Each of the light-emitting element layer 300 and the color conversion unit 500 may include a region overlapping each of the pixels PX1, PX2, and PX3 of the light-emitting device 10_1. For convenience of description, the region in which the light-emitting element layer 300 overlaps the first pixel PX1 is defined as a first pixel portion, the region in which the light-emitting element layer 300 overlaps the second pixel PX2 is defined as a second pixel portion, and the region in which the light-emitting element layer 300 overlaps the third pixel PX3 is defined as a third pixel portion. Similarly, the region in which the color conversion unit 500 overlaps the first pixel PX1 is defined as a first pixel layer, the region in which the color conversion unit 500 overlaps the second pixel PX2 is defined as a second pixel layer, and the region in which the color conversion unit 500 overlaps the third pixel PX3 is defined as a third pixel layer.

Because the first to third pixel portions of the light-emitting element layer 300 are substantially the same as those of the light-emitting element layer 300 of the light-emitting device 10 described with reference to FIG. 2, overlapping descriptions will not be repeated.

The light-emitting element layer 300 may include the light-emitting element 350 and emit light in a set or specific wavelength band so that the light may be provided to the color conversion unit 500. The color conversion unit 500 may convert the light in the set or specific wavelength band provided from the light-emitting element layer 300 into light in another wavelength band. The color conversion unit 500 may include a support substrate 510, a color conversion layer 520, a color filter layer 550, a light blocking member BM, and a planarization layer OC.

The support substrate 510 may support the color filter layer 550, the color conversion layer 520, the light blocking member BM, and the like disposed therebelow. The support substrate 510 may emit light provided from the light-emitting element layer 300 to the outside of the light-emitting device 10_1.

The support substrate 510 may be a transparent insulating substrate. For example, the support substrate 510 may include glass, quartz, and/or a light-transmitting plastic material, but the present disclosure is not limited thereto.

The light blocking member BM may be disposed below the support substrate 510. The light blocking member BM may be a region in which the transmission of the light provided from the light-emitting element layer 300 is substantially blocked or reduced. Accordingly, the mixing of light emitted from the pixel layers may be prevented or reduced and thus color reproducibility may be improved. The light blocking member BM may be disposed in a set or predetermined pattern. For example, the light blocking member BM may have a lattice pattern surrounding the pixel layers.

The light blocking member BM may include a material having a high absorption rate for visible light. For example, the light blocking member BM may include a metal such as chromium, a metal nitride, a metal oxide, and/or a resin material colored in black, but the present disclosure is not limited thereto.

The color conversion layer 520 may convert light incident from the light-emitting element layer 300 into light in another wavelength band. For example, when light having a blue color L3 is incident from the light-emitting element layer 300, the color conversion layer 520 may convert the light having the blue color L3 into light having a green color L2. However, the present disclosure is not limited thereto.

The color conversion layer 520 may be disposed between the light blocking members BM which are disposed below the support substrate 510 to be spaced apart from each other. However, the present disclosure is not limited thereto, and a portion of the color conversion layer 520 may be disposed to overlap at least a portion of the light blocking member BM. For example, the color conversion unit 500 may include first to third color conversion layers, and the first to third color conversion layers may convert the incident light into pieces or beams of light having different colors and emit the pieces or beams of light.

The color conversion layer 520 may include color conversion particles 530 that convert incident first light in a set or arbitrary wavelength band into light in a wavelength band different from that of the first light. The color conversion particles 530 may include a quantum dot material and/or a phosphor material.

In the case in which the color conversion particles 530 are quantum dot materials, when the first light in a set or arbitrary wavelength band is incident, electrons in a valence band (VB) of the quantum dot material are excited to a conduction band (CB) level. The second light in the wavelength band of the converted light may be emitted while the electrons transition back to the VB. When the color conversion particles 530 are quantum dot materials, the wavelength of the emitted light may be controlled by adjusting the particle size of the quantum dot materials. For example, the particle size of the quantum dot material may have a diameter in a range of about 55 Å to 65 Å, and blue light may be incident to emit red light. Further, the particle size of the quantum dot material may have a diameter in a range of about 40 Å to 50 Å, and blue light may be incident to emit green light. However, the present disclosure is not limited thereto.

The color conversion particles 530 may be dispersed in a light-transmitting resin R. Any suitable material may be used as the light-transmitting resin R without any particular limitation as long as the material does not adsorb light incident on the color conversion layer 520 and does not affect light absorption and emission of the color conversion particles 530. For example, the light-transmitting resin R may include an organic material such as an epoxy resin, an acrylic resin, and/or the like, but the present disclosure is not limited thereto. The color conversion layer 520 including the color conversion particles 530 may be formed using various suitable processes such as an ink jet injection method, a photoresist (PR) method, and/or the like, but the present disclosure is not limited thereto.

The color filter layer 550 may be disposed between the color conversion layer 520 and the support substrate 510. The color filter layer 550 may be a layer for determining a color of the light incident from the light-emitting element layer 300 and passing through the color conversion layer 520 and being finally displayed on the pixels PX1, PX2, and PX3 of the light-emitting device 10.

The color filter layer 550 may function as a color-transmissive layer for transmitting incident light without change. However, the present disclosure is not limited thereto, and the color filter layer 550 may be a color filter or a wavelength-selective optical filter that transmits the first light in a set or arbitrary wavelength band but blocks or reduces the second light, the third light, and/or the like in other wavelength bands.

The color filter layer 550 may include a transparent organic film and may function as a color-transmissive layer for transmitting incident light without change. Further, in order to increase the color purity of the transmitted color, the color filter layer 550 may include a colorant having a color in a set or arbitrary wavelength band. The colorant may be dispersed in the transparent organic film of the color filter layer 550. However, the present disclosure is not limited thereto.

The color filter layer 550 may include a first color filter layer 551, a second color filter layer 552, and a third color filter layer 553. The first color filter layer 551, the second color filter layer 552, and the third color filter layer 553 may be disposed on the first to third pixel layers. Pieces or beams of light incident on the color conversion layer 520 from each of the pixel portions of the light-emitting element layer 300 may have different colors. Accordingly, in order to control the color displayed on each of the pixels PX1, PX2, and PX3 of the light-emitting device 10_1, the color filter layer 550 may be selectively disposed on the pixel layers.

For example, the first color filter layer 551 may be disposed on the first pixel layer and may function as a color-transmissive layer for transmitting incident light without change. The second color filter layer 552 and the third color filter layer 553 may be disposed on the second pixel layer and the third pixel layer, respectively, and may function as color filters that transmit only light in a set or specific wavelength band and block or reflect other pieces or beams of light. However, the present disclosure is not limited thereto, and all of the first color filter layer 551, the second color filter layer 552, and the third color filter layer 553 may function as color filters. For example, the first color filter layer 551 may transmit light having a red color L1, the second color filter layer 552 may transmit light having a green color L2, and the third color filter layer 553 may transmit light having a blue color L3.

A capping layer CL may be disposed on an outer surface of the color conversion layer 520 to cover and protect the color conversion particles 530, the light-transmitting resin R, and/or the like. The capping layer CL may include an inorganic material. For example, the capping layer CL may include at least one selected from silicon oxide ($SiO_x$), silicon nitride ($SiN_x$), and silicon oxynitride ($SiO_xN_y$), but the present disclosure is not limited thereto.

The planarization layer OC may be disposed below the color conversion layer 520, the color filter layer 550, the light blocking member BM, and the like. The planarization layer OC may be disposed to cover all of the members disposed below the support substrate 510. Accordingly, the planarization layer OC may planarize a lower surface of the color conversion unit 500 to minimize or reduce a step difference caused by the members disposed below the support substrate 510. Because the lower surface of the color conversion unit 500 is planarized by the planarization layer OC, the light-emitting device 10 may be manufactured by bonding with the light-emitting element layer 300 manufactured through a separate process.

The planarization layer OC may include an organic material. For example, the planarization layer OC may include a thermosetting resin. For example, the planarization layer OC may include at least one selected from the group consisting of a cardo resin, a polyimide resin, an acrylic resin, a siloxane resin, and a silsesquioxane resin, but the present disclosure is not limited thereto.

When the color conversion unit 500 and the light-emitting element layer 300 are manufactured by separate processes and bonded, the color conversion unit 500 and the light-emitting element layer 300 may be bonded by an adhesive layer PSI. The adhesive layer PSI may be disposed on an upper surface of the light-emitting element layer 300 and the surface planarized by the planarization layer OC of the color conversion unit 500, and the light-emitting element layer 300 and the color conversion unit 500 may be coupled to each other.

Any suitable material may be used as the adhesive layer PSI without any particular limitation as long as the material is a type or kind of material that may bond a plurality of members to be adhered. For example, the adhesive layer PSI may be made of an optical clear adhesive (OCA), an optical clear resin (OCR), a pressure sensitive adhesive (PSA), and/or the like.

As described with reference to FIG. 19, the light-emitting device 10_1 may include one type or kind of light-emitting element 350 and further include the color conversion unit 500 that realizes the red color L1, the green color L2, and the blue color L3, and thus the light-emitting device 10_1 may be implemented as a display device that displays an image.

Figure 20:
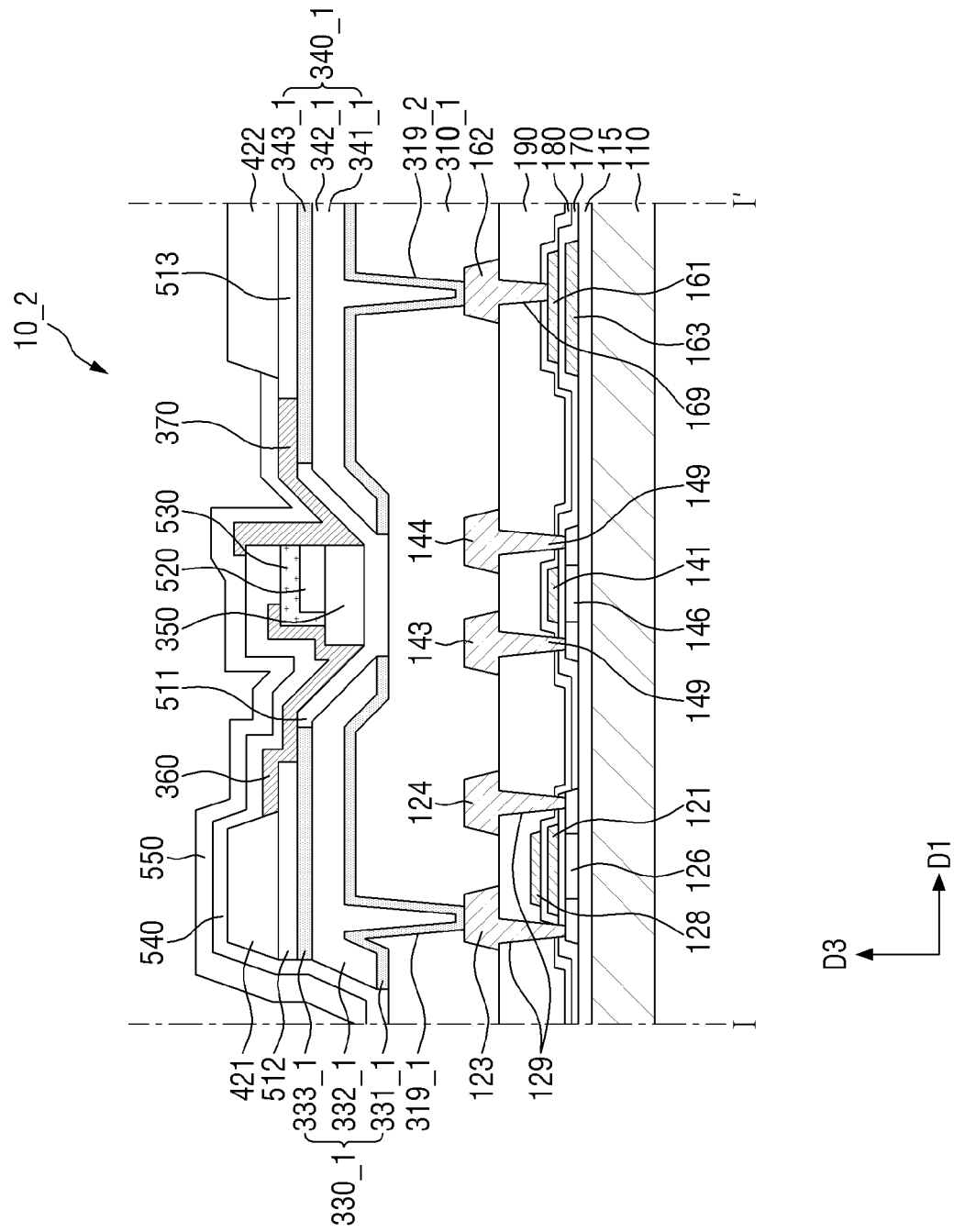
FIG. 20 is a cross-sectional view illustrating another example of the light-emitting device taken along line I-I' of FIG. 1.

FIG. 20 is a cross-sectional view illustrating another example of the light-emitting device taken along line I-I' of FIG. 1.

Referring to FIGS. 1, 2, and 20, a light-emitting device 10_2 of FIG. 20 is different from the light-emitting device 10 described with reference to FIG. 2 in that a fourth insulating layer 310_1 has a convex portion and a first electrode 330_1 and a second electrode 330_2 are disposed on the convex portion of the fourth insulating layer 310_1. Except for the fourth insulating layer 310_1, the first electrode 330_1, and the second electrode 330_2, the light-emitting device 10_2 is substantially the same as or similar to the light-emitting device 10 of FIG. 2. Therefore, overlapping descriptions will not be repeated.

The convex portion may be formed in an upper surface of the fourth insulating layer 310_1. As illustrated in FIG. 20, a portion of the upper surface of the fourth insulating layer 310_1 overlapping (or in contact with) a second electrode 340_1 may protrude upward as compared to other portions. For example, a portion of the upper surface of the fourth insulating layer 310_1 may protrude upward from an edge of a lower surface of the second electrode 340_1 along a closed loop which is positioned inside the second electrode 340_1 by a thickness of the second electrode 340_1. A thickness of the convex portion of the fourth insulating layer 310_1 is not limited but may be, for example, 3,000 Å or 5,000 Å or more.

Similarly, a portion of the upper surface of the fourth insulating layer 310_1 overlapping a first electrode 330_1 may protrude upward as compared to other portions. For example, a portion of the upper surface of the fourth insulating layer 310_1 may protrude upward from an edge of a lower surface of the first electrode 330_1 along a closed loop which is positioned inside the first electrode 330_1 by a thickness of the first electrode 330_1.

The first electrode 330_1 and the second electrode 340_1 may be substantially the same as the first electrode 330 and the second electrode 340 described with reference to FIG. 2 except for thicknesses thereof. Therefore, overlapping descriptions will not be repeated.

The convex portion is formed in the upper surface of the fourth insulating layer 310_1, and thus the thickness of the first electrode 330_1 and the thickness of the second electrode 340_1 may be relatively reduced. For example, when the thickness of the first electrode 330 and the thickness of the second electrode 340 illustrated in FIG. 2 is about 6,000 Å and the thickness of the convex portion of the fourth insulating layer 310_1 is about 3,000 Å, the thickness of the first electrode 330_1 and the thickness of the second electrode 340_1 illustrated in FIG. 20 may be about 3,000 Å.

The first electrode 330_1 and the second electrode 340_1 may have inclined surfaces due to the convex portion of the fourth insulating layer 310_1. Therefore, the first electrode 330_1 and the second electrode 340_1 having an inclined surface with a set or specific inclination angle (e.g., an angle of 60 degrees or less) may be more easily formed.

As described with reference to FIG. 20, the convex portion may be formed in the upper surface of the fourth insulating layer 310_1 (or the circuit board 100) and, in this case, the first and second electrodes 330_1 and 340_1 having a taper angle sufficient to reflect light emitted from a side surface of a light-emitting element 350 may be more easily formed.

Figure 21:
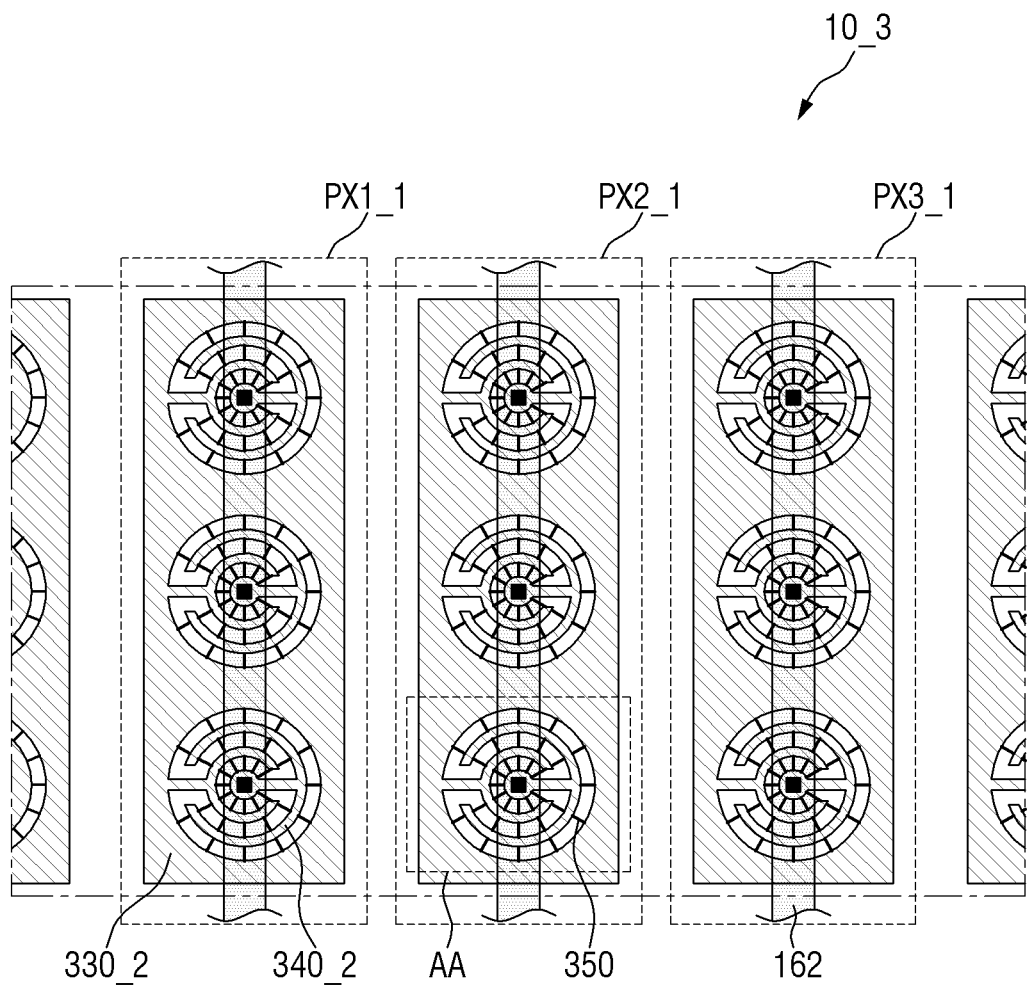
FIG. 21 is a plan view illustrating a light-emitting device according to another embodiment.
Figure 22:
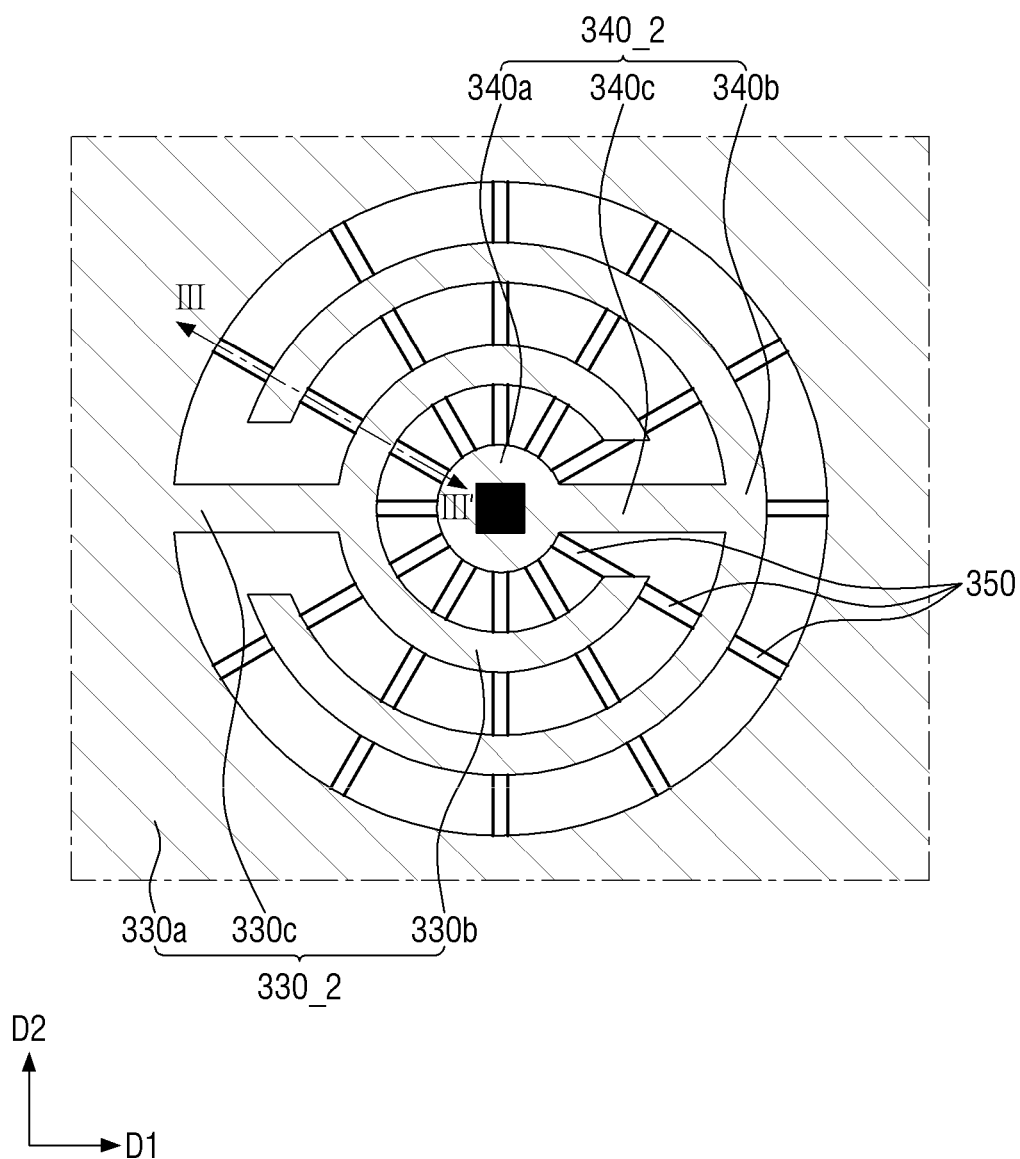
FIG. 22 is an enlarged view of region AA of FIG. 21.

FIG. 21 is a plan view illustrating a light-emitting device according to another embodiment. FIG. 22 is an enlarged view of region AA of FIG. 21. Referring to FIGS. 1, 21, and 22, a light-emitting device 10_3 may include first to third pixels PX1_1, PX2_1, and PX3_1. Because the first to third pixels PX1_1, PX2_1, and PX3_1 are substantially identical to each other, common characteristics of the first to third pixels PX1_1, PX2_1, and PX3_1 will be described based on the first pixel PX1_1.

The first pixel PX1 is different from the first pixel PX1 described with reference to FIG. 1 in that the first pixel PX1 includes first electrodes 330_2 and second electrodes 340_2. The first electrode 330_2 and the second electrode 340_2 may be substantially the same as or similar to the first electrode 330 and the second electrode 340 described with reference to FIGS. 1 and 2 except for shapes thereof. Therefore, overlapping descriptions will not be repeated.

The plurality of second electrode 340_2 may be provided, and three second electrodes 340_2 may be provided in the first pixel PX1_1, similar to the second electrode 340 illustrated in FIG. 1. The above configuration is an example and the present disclosure is not limited thereto. For example, one electrode 340_2, two electrodes 340_2, or four or more second electrodes 340_2 may be include in the first pixel PX1_1.

As illustrated in FIG. 22, the second electrode 340_2 may include a central portion 340a, a first peripheral portion 340b, and a first connection portion 340c.

The central portion 340a may have a circular planar shape and may have a set or specific area or a set or specific size. The central portion 340a may have an area greater than a planar area of the contact hole 319_2 described with reference to FIG. 1.

The first peripheral portion 340b may be spaced apart from the central portion 340a to extend along an outer surface of the central portion 340a and may have both ends spaced apart from each other. For example, the peripheral portion 340b may have a planar shape of a reverse C shape or a ring shape in which a portion is cut.

The first connection portion 340c may connect the central portion 340a to the first peripheral portion 340b. The first connection portion 340c may extend from the central portion 340a in a set or specific direction (e.g., a first direction D1) to be connected to the first peripheral portion 340b.

Meanwhile, the first electrode 330_2 may have a shape corresponding to the second electrode 340_2, may be spaced apart from the second electrode 340_2, and may surround the entirety of the second electrode 340_2.

The first electrode 330_2 may include a main body portion 330a having a hole therein, a second peripheral portion 330b disposed in the hole, and a second connection portion 330c which extends from the main body portion and is connected to the second peripheral portion 330b. The second electrode 340_2 may be disposed in the hole of the main body portion 330a. The second peripheral portion 330b may be disposed between the central portion 340a and the first peripheral portion 340b of the second electrode 340_2. The second peripheral portion 330b may be spaced apart from the central portion 340a of the second electrode 330_2 to extend along the outer surface of the central portion 340a, and may have both ends spaced apart from each other with the first connection portion 340c of the second electrode 330_2 interposed therebetween. The second peripheral portion 330b may have a planar shape that is the same as or similar to the planar shape of the first peripheral portion 340b. The second connection portion 330c may cross both ends of the first peripheral portion 340b of the second electrode 340_2 and extend, and may connect the second peripheral portion 330b to the main body portion 330a.

The first electrode 330_2 may be spaced a set or predetermined interval from the second electrode 340_2 along an edge of the second electrode 340_2. The light-emitting element 350 may be disposed between the first electrode 330_2 and the second electrode 340_2 (or in a space between the first electrode 330_2 and the second electrode 340_2).

As illustrated in FIG. 22, the light-emitting device 10_3 may have a region in which the light-emitting elements formed by three concentric circles are arranged. Accordingly, the density and arrangement efficiency of the light-emitting element 350 may be improved, and the light emission characteristics (e.g., maximum luminance) of the light-emitting device 10_3 may be improved.

Meanwhile, in FIGS. 21 and 22, the shape of the first electrode 330_2 (or the shape of the second peripheral portion 330b), and the shape of the second electrode 340_2 (or the shape of the central portion 340a, the shape of the first peripheral portion 340b) are illustrated as having a ring shape, but the present disclosure is not limited thereto. For example, an outermost portion of the first peripheral portion 340b of the second electrode 340_2 may have a shape such as a polygonal shape such as a triangular shape, a rectangular shape, a hexagonal shape, an octagonal shape, or the like, or an elliptical shape. The shape of the second electrode 340_2 is not limited to a set or specific shape as long as the shape is an island shape that is independently disposed from other electrodes.

Figure 23:
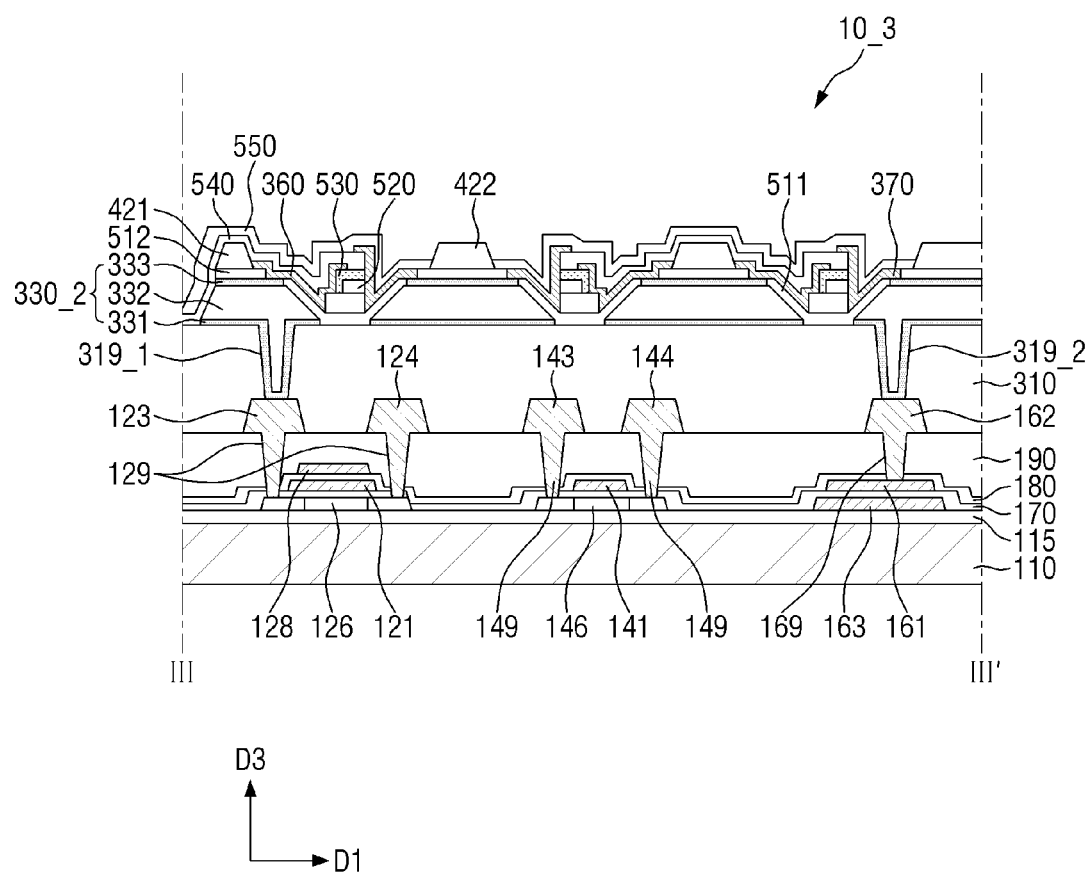
FIG. 23 is a cross-sectional view illustrating an example of a light-emitting device taken along line III-III' of FIG. 22.

FIG. 23 is a cross-sectional view illustrating an example of the light-emitting device taken along line III-III' of FIG. 22.

Referring to FIGS. 2 and 21 to 23, a light-emitting device 10_3 of FIG. 23 may be substantially the same as the light-emitting device 10 of FIG. 2 except for the number of light-emitting elements 350 included therein. Therefore, overlapping descriptions will not be repeated.

As illustrated in FIGS. 22 and 23, three light-emitting elements 350 may be disposed between the edge of the second electrode 340_2 and the center of an area of the second electrode 340_2.

Referring to FIG. 23, from left to right, a first electrode 330_2 (or a main body portion 330a), a second electrode 340_2 (or a first peripheral portion 340b), a first electrode 330_2 (or a second peripheral portion 330b), and a second electrode 340_2 (or a central portion 340a) may be sequentially disposed, and the light-emitting elements 350 may be disposed between the above components.

A structure of a light-emitting portion between the main body portion 330a and the first peripheral portion 340b may be the same as a structure of the light-emitting element layer 300 illustrated in FIG. 2, a structure of a light-emitting portion between the first peripheral portion 340b and the second peripheral portion 330b may be the same as a structure in which left and right sides of the light-emitting element layer 300 illustrated in FIG. 2 are reversed, and a structure of a light-emitting portion between the second peripheral portion 330b and the central portion 340a may be the same as a structure of the light-emitting element layer 300 illustrated in FIG. 2.

Figure 24:
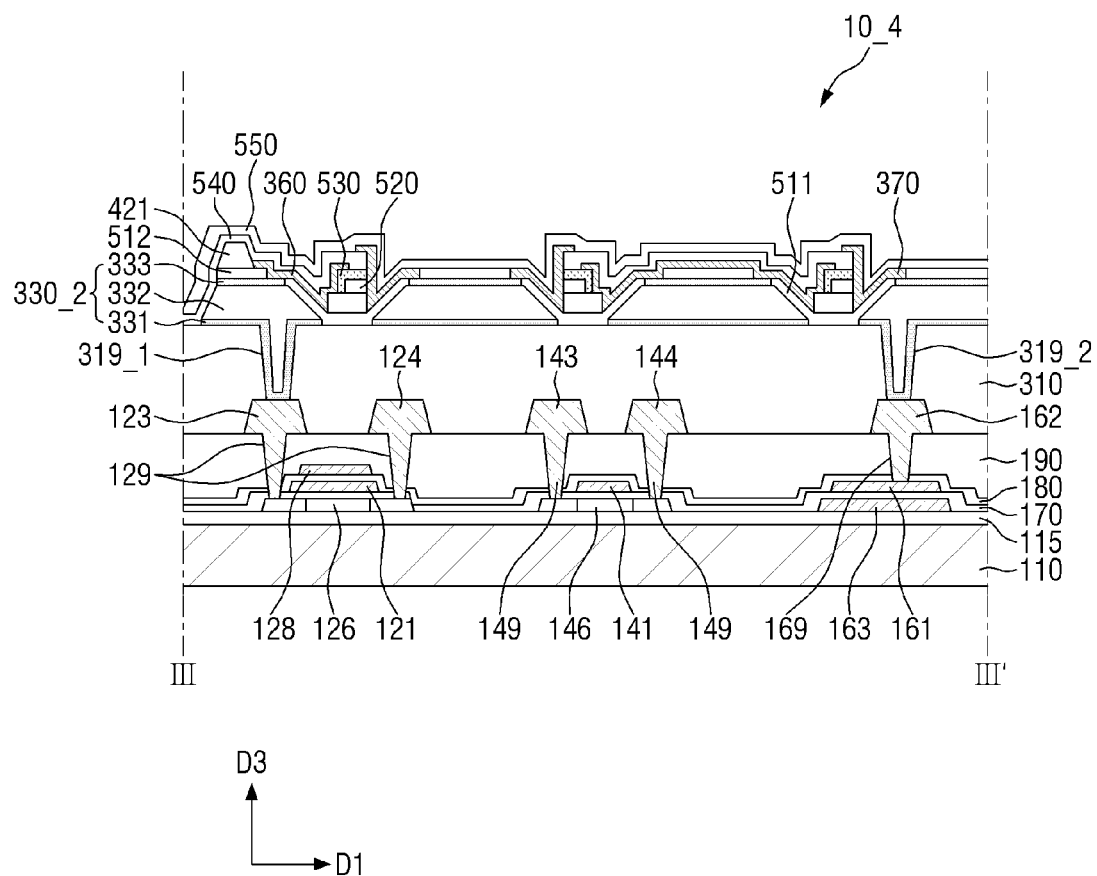
FIG. 24 is a cross-sectional view illustrating another example of the light-emitting device taken along line III-III' of FIG. 22.

FIG. 24 is a cross-sectional view illustrating another example of the light-emitting device taken along line III-III' of FIG. 22.

Referring to FIGS. 21 to 24, the light-emitting device 10_4 of FIG. 24 is different from the light-emitting device 10_3 of FIG. 23 in that the light-emitting device 10_4 does not include a second pixel wall 422.

In the light-emitting device 10_4, light-emitting elements 350 having relatively high density (or a large number of light-emitting elements 350) are disposed over an entire pixel region (e.g., a region in which the first pixel PX1 is disposed), and thus the second pixel wall 422 may not be required. In this case, a light-emitting element solution S including the light-emitting elements 350 may be disposed in a space formed by a first pixel wall 421 on a pixel region.

In concluding the detailed description, those skilled in the art will appreciate that many variations and modifications can be made to the disclosed embodiments without substantially departing from the principles of the present disclosure. Therefore, the disclosed embodiments of the disclosure are used in a generic and descriptive sense only and not for purposes of limitation.

The invention claimed is:

1. A light-emitting device comprising:
   a substrate;
   a first electrode on the substrate, the first electrode comprising holes and having inclined surfaces along peripheries of the holes;
   second electrodes on the substrate, each of which is in a respective one of the holes of the first electrode;
   light-emitting elements between the first electrode and the second electrodes, the light-emitting elements being electrically connected to the first electrode and the second electrodes; and
   an insulating pattern on the inclined surfaces and between respective ones of the inclined surfaces and the light-emitting elements,
   wherein the insulating pattern extends completely across and under the respective ones of the light-emitting elements,
   wherein the first electrode comprises a first metal bonding layer,
   wherein the holes of the first electrode extend through the first metal bonding layer, and
   wherein the insulating pattern extends through the holes to protrude into the first metal bonding layer.

2. The light-emitting device of claim 1, further comprising:
   a transistor electrically connected to the first electrode; and
   a power line electrically connected to the second electrodes.

3. The light-emitting device of claim 2, wherein the power line is below the substrate, and
   each of the second electrodes is electrically connected to the power line through a through-hole which passes through the substrate to expose the power line.

4. The light-emitting device of claim 1, wherein the first electrode further comprises a metal conductive layer on the first metal bonding layer, and a second metal bonding layer on the metal conductive layer,
   the metal conductive layer has a thickness which is greater than a thickness of the first metal bonding layer and greater than a thickness of the second metal bonding layer, and
   the inclined surfaces are on the metal conductive layer, and
   a portion of the insulting pattern is disposed between the inclined surfaces and the light-emitting elements.

5. The light-emitting device of claim 4, wherein the metal conductive layer comprises a reflective material, and
   light emitted from the light-emitting elements is reflected by the metal conductive layer.

6. The light-emitting device of claim 4, wherein an inclination angle formed by the inclined surface based on the substrate is less than 60 degrees and greater than 20 degrees.

7. The light-emitting device of claim 6, wherein a first taper angle of an inner sidewall of the metal conductive layer is different from a second taper angle of an outer sidewall of the metal conductive layer, and
   the inner sidewall of the metal conductive layer is adjacent to the second electrode.

8. The light-emitting device of claim 7, wherein the inner sidewall of the metal conductive layer is formed through a process different from a process of forming the outer sidewall of the metal conductive layer.

9. The light-emitting device of claim 1, further comprising a first pixel wall on the first electrode,
wherein the first pixel wall has bank holes corresponding to the holes of the first electrode.

10. The light-emitting device of claim 9, further comprising a second pixel wall on each of the second electrodes.

11. The light-emitting device of claim 1, wherein each of the second electrodes has a central portion, a first peripheral portion which is spaced apart from the central portion and extends along an edge of the central portion, and the first peripheral portion has two end portions spaced apart from each other and a first connection portion to connect the central portion to the first peripheral portion, and
the first electrode comprises a main body portion having the holes, a second peripheral portion which extends along the edge of the central portion between the central portion and the first peripheral portion and has two end portions with the first connection portion interposed therebetween, and a second connection portion which crosses the end portions of the first peripheral portion to connect the second peripheral portion to the main body portion.

12. The light-emitting device of claim 11, wherein the central portion has a circular planar shape, and
each of the first peripheral portion and the second peripheral portion has a ring shape in which a portion is cut in a top view.

13. The light-emitting device of claim 1, further comprising:
a first insulating layer below the light-emitting elements between the first electrode and the second electrodes;
an organic insulating layer covering the light-emitting elements and exposing two end portions of each of the light-emitting elements;
a first contact electrode which is electrically connected to the first electrode, is on the organic insulating layer, and is in contact with a first end portion of each of the light-emitting elements; and
a second contact electrode which is electrically connected to the second electrodes, is on the organic insulating layer, and is in contact with a second end portion of each of the light-emitting elements.

14. The light-emitting device of claim 13, wherein the first contact electrode and the second contact electrode face each other and are spaced apart from each other, and
the light-emitting device further comprises a second insulating layer covering the first contact electrode and the second contact electrode, the second insulating layer being in a region in which the first contact electrode is spaced apart from the second contact electrode.

15. The light-emitting device of claim 14, wherein the first contact electrode and the second contact electrode are substantially coplanar.

16. The light-emitting device of claim 13, wherein each of the light-emitting elements has a cylindrical shape, and
a portion of a lower surface of each of the light-emitting elements is in direct contact with the first insulating layer.

* * * * *